(12) United States Patent
Kwon et al.

(10) Patent No.: US 11,031,436 B2
(45) Date of Patent: Jun. 8, 2021

(54) DISPLAY DEVICE

(71) Applicant: SAMSUNG DISPLAY CO., LTD., Yongin-si (KR)

(72) Inventors: Sun Ja Kwon, Yongin-si (KR); Won Kyu Kwak, Yongin-si (KR); Hwan Soo Jang, Yongin-si (KR); Seung Yeon Cho, Yongin-si (KR); Hyun Ae Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 260 days.

(21) Appl. No.: 15/609,480

(22) Filed: May 31, 2017

(65) Prior Publication Data

US 2018/0083072 A1    Mar. 22, 2018

(30) Foreign Application Priority Data

Sep. 19, 2016   (KR) .......................... 10-2016-0119503

(51) Int. Cl.
*H01L 27/32* (2006.01)
*G09G 3/3291* (2016.01)

(52) U.S. Cl.
CPC ........ *H01L 27/3211* (2013.01); *G09G 3/3291* (2013.01); *H01L 27/3262* (2013.01);
(Continued)

(58) Field of Classification Search
CPC ............. H01L 27/3211; H01L 27/3262; H01L 27/124; H01L 27/3218; H01L 27/3279;
(Continued)

(56) References Cited

U.S. PATENT DOCUMENTS 8,552,639 B2    10/2013 Kim et al.
2006/0060850 A1*  3/2006 Kwak .................. H01L 27/124
                                                    257/59
(Continued)

FOREIGN PATENT DOCUMENTS

EP            2814074 A1    12/2014
KR        10-1462538        11/2014

OTHER PUBLICATIONS

European Search Report dated Mar. 14, 2018.
European Search Report dated Nov. 2, 2017 with respect to the European Patent Application No. 17187919.0.

*Primary Examiner* — Kenneth Parker
*Assistant Examiner* — Long H Le
(74) *Attorney, Agent, or Firm* — Lewis Roca Rothgerber Christie LLP

(57) ABSTRACT

A display device includes a substrate, a pixel area, and a plurality of data lines. The substrate includes display and non-display areas. The pixel area is in the display area and includes a first pixel column and a second pixel column. The pixels in the first and second columns emit light of different colors. The data lines are respectively coupled to the first pixel column and the second pixel column. In the non-display area, a data line is coupled to one of the first or second pixel columns corresponding to a color on which influence of a resistance is greater than on another color. The data lines has a line or contact structure with a resistance less than a resistance of a line or contact structure of a remaining data line coupled to a remaining pixel column.

32 Claims, 14 Drawing Sheets

(52) U.S. Cl.
CPC ............... *G09G 2300/0426* (2013.01); *G09G 2320/0223* (2013.01)

(58) Field of Classification Search
CPC ......... G09G 3/3291; G09G 2300/0426; G09G 2320/0223
See application file for complete search history.

(56) References Cited

U.S. PATENT DOCUMENTS

| | | | |
|---|---|---|---|
| 2007/0285370 A1* | 12/2007 | Kim ...................... | G02F 1/1345 345/92 |
| 2008/0001875 A1 | 1/2008 | Yuuki et al. | |
| 2008/0129944 A1* | 6/2008 | Park ...................... | G02F 1/1345 349/150 |
| 2009/0033609 A1* | 2/2009 | Ashizawa ............ | G02F 1/13458 345/92 |
| 2012/0169578 A1* | 7/2012 | Kim ...................... | G09G 3/3688 345/93 |
| 2013/0057521 A1 | 3/2013 | Kim | |
| 2013/0321251 A1 | 12/2013 | Kang et al. | |
| 2014/0117320 A1* | 5/2014 | Jung .................. | H01L 27/3276 257/40 |
| 2014/0145153 A1 | 5/2014 | Kim et al. | |
| 2014/0240521 A1* | 8/2014 | Kwak .................. | H04N 17/004 348/189 |
| 2015/0015553 A1* | 1/2015 | Cho ...................... | G09G 3/3611 345/208 |
| 2015/0241501 A1* | 8/2015 | Jang ...................... | G09G 3/006 324/527 |
| 2016/0172428 A1* | 6/2016 | Song .................. | H01L 27/3276 257/99 |
| 2016/0260367 A1 | 9/2016 | Kwak et al. | |
| 2018/0130856 A1 | 5/2018 | Kim et al. | |

\* cited by examiner

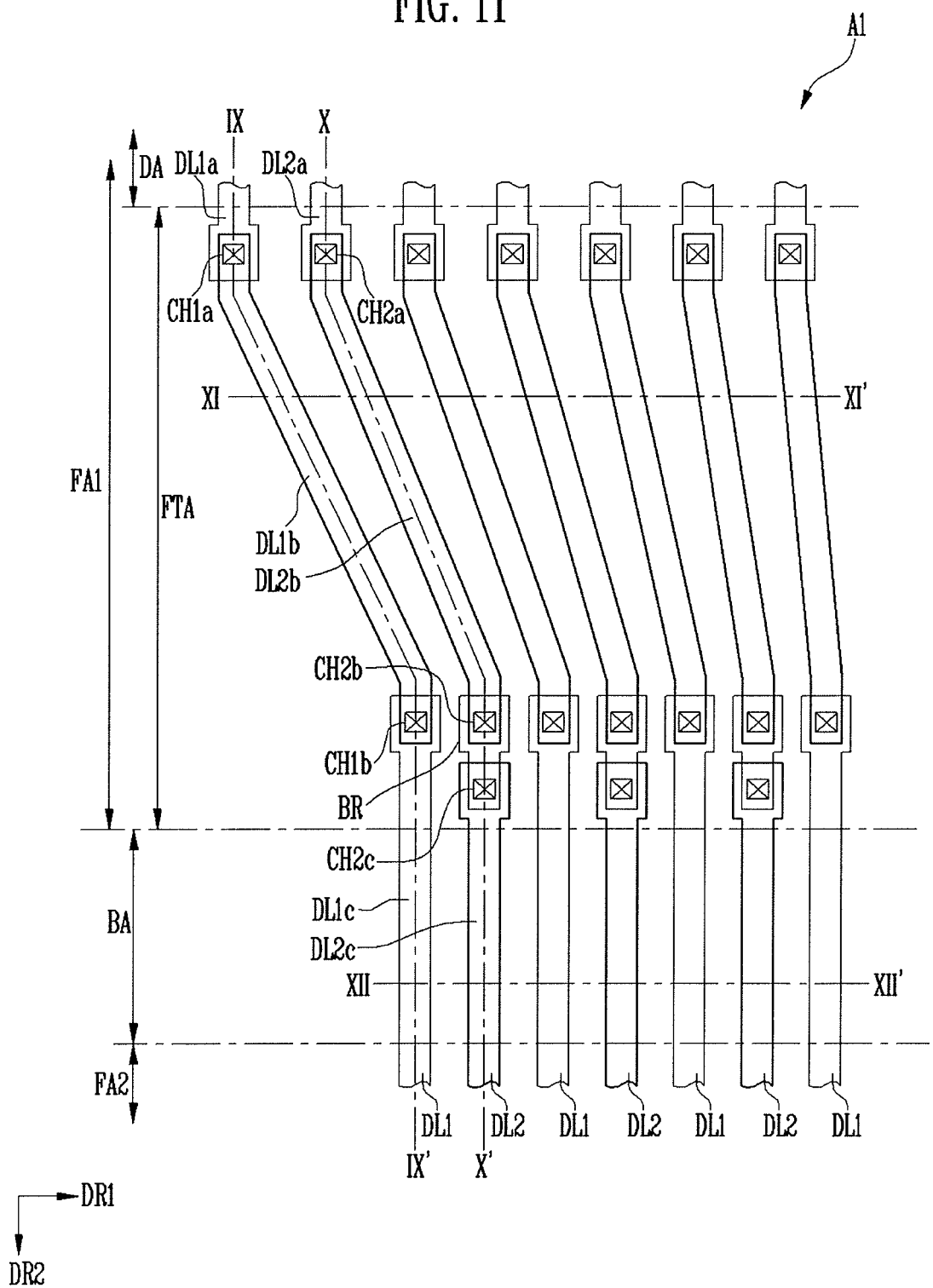

DISPLAY DEVICE

CROSS-REFERENCE TO RELATED APPLICATION

Korean Patent Application No. 10-2016-0119503, filed on Sep. 19, 2016, and entitled, "Display Device," is incorporated by reference herein in its entirety.

BACKGROUND

1. Field

One or more embodiments described herein relate to a display device.

2. Description of the Related Art

An organic light-emitting display device generates an image based on light emitted from pixels that include organic light-emitting diodes. The pixels may include red, green and blue pixels arranged in various forms. When pixels are arranged in a stripe form, a black matrix between the pixels may reduce aperture ratio and the quality of high-resolution images. Another pixel structure, known as a PenTile matrix structure, may be more suitable for producing higher resolution images.

SUMMARY

In accordance with one or more embodiments, a display device includes a substrate including a display area and a non-display area; a pixel area in the display area, the pixel area including a first pixel column including a plurality of pixels and a second pixel column including a plurality of pixels, the pixels in the first and second columns to emit light of different colors; and a plurality of data lines respectively coupled to the first pixel column and the second pixel column, wherein, in the non-display area, a data line is coupled to one of the first pixel column or the second pixel column corresponding to a color on which influence of a resistance is greater than on another color, and has a line or contact structure with a resistance less than a resistance of a line or contact structure of a remaining data line coupled to a remaining pixel column.

In the display area, influence of the first pixel column on a resistance may be greater than an influence of the second pixel column on the resistance, and in the non-display area, a resistance of the data line coupled to the first pixel column may be less than a resistance of the data line coupled to the second pixel column. In the non-display area, a width of the data line coupled to the first pixel column may be greater than a width of the data line coupled to the second pixel column. In the non-display area, a length of the data line coupled to the first pixel column may less than a length of the data line coupled to the second pixel column.

In the non-display area, portions of each of the data lines are coupled to each other through at least one contact hole, and the portions of the data line coupled to the first pixel column are coupled to each other through a smaller number of contact holes than are the portions of the data line coupled to the second pixel column. The first pixel column may include first pixels in the display area and arranged in a column direction, the first pixels to emit light of the first color and second pixels to emit light of a second color and arranged alternately with the first pixels, and the second pixel column may include third pixels to emit light of a third color.

The display device may include first to third insulating layers successively stacked on the substrate, wherein the data lines include a first data line coupled to the first pixel column, and a second data line coupled to the second pixel column, and wherein the first data line is on the third insulating layer in the display area and is at least partially on the second insulating layer in the non-display area, and the second data line is on the third insulating layer in the display area and is at least partially on the first insulating layer in the non-display area. The first color may be red, the second color may be blue, and the third color may be green.

The non-display area may include a fan-out area adjacent to the display area. The first data line may be on the second insulating layer in the fan-out area, and the second data line may be on the first insulating layer in the fan-out area. The non-display area may include a bent area adjacent to the fan-out area. The first data line may include a first pixel-unit data line in the display area, a first fan-out line in the fan-out area, and a first link line in the bent area. The first pixel-unit data line and the first link line may be on third insulating layer and the first fan-out line may be on the second insulating layer.

The third insulating layer may include first and second contact holes that expose portions of the first fan-out line, the first pixel-unit data line is coupled to the first fan-out line through the first contact hole, and the first fan-out line is coupled to the first link line through the second contact hole. The second data line may include a second pixel-unit data line in the display area, a second fan-out line in the fan-out area, and a second link line in the bent area.

The second and third insulating layers may include third and fourth contact holes that expose portions of the second fan-out line, the second pixel-unit data line may be coupled to the second fan-out line through the third contact hole, and the second fan-out line may be coupled to the second link line through the fourth contact hole. The display device may include a bent-part insulating layer in the bent area of the substrate. The first to third insulating layers may have an opening that exposes a portion of the substrate, and the bent-part insulating layer may be in the opening.

At least a portion of the first data line maybe on the bent-part insulating layer in the bent area, and at least a portion of the second data line may be on the bent-part insulating layer in the bent area. The first pixel-unit data line may be on the third insulating layer, the first fan-out line may be on the second insulating layer, and the first link line may be on the bent-part insulating layer. The second pixel-unit data line may be on the third insulating layer, the second fan-out line may be on the first insulating layer, and the second link line may be on the bent-part insulating layer.

The display device may include a fourth insulating layer on the third insulating layer, wherein the second data line includes a bridge pattern on the fourth insulating layer. The second pixel-unit data line may be on the third insulating layer, the second fan-out line may be on the first insulating layer, the bridge pattern may be on the third insulating layer, and the second link line may be on the fourth insulating layer.

The second and third insulating layers may have third and fourth contact holes that expose portions of the second fan-out line, and the fourth insulating layer has a fifth contact hole that exposes a portion of the bridge pattern, and the second pixel-unit data line may be coupled to the second fan-out line through the third contact hole, the second fan-out line is coupled to the bridge pattern through the fourth contact hole, and the bridge pattern is coupled to the second link line through the fifth contact hole.

The first pixel column and the second pixel column respectively may include a plurality of first pixel columns and a plurality of second pixel columns, and the first pixel columns and the second pixel columns maybe alternately arranged in a row direction. The first data line and the second data line respectively may include a plurality of first data lines and a plurality of second data lines, and the first data lines and the second data lines may be alternately arranged in the row direction.

Each of the first pixels, the second pixels and the third pixels may include a transistor which includes: an active layer on the substrate; a gate electrode on the first insulating layer; an upper capacitor electrode on the second insulating layer; and a source electrode and a drain electrode on the third insulating electrode. A portion of the first data line or the second data line in the non-display area may be on a same layer as the source electrode and the drain electrode are provided and includes a same material as is in the source electrode and the drain electrode.

A portion of the second data line in the non-display area may be on a same layer as the gate electrode and includes a same material as is in the gate electrode. A portion of the first data line in the non-display area may be on a same layer as the upper capacitor electrode and includes a same material as in the upper capacitor electrode. The display device may include a fourth insulating layer on the third insulating layer; and connection patterns on the fourth insulating layer and coupled to the drain electrode, wherein a portion of the second data line in the non-display area is on a same layer as a layer on which the connection patterns and includes a same material as is in the connection patterns. Areas of at least two pixels among the first pixels, the second pixels, and the third pixels may differ from each other.

BRIEF DESCRIPTION OF THE DRAWINGS

Features will become apparent to those of skill in the art by describing in detail exemplary embodiments with reference to the attached drawings in which:

FIG. 11 illustrates another embodiment of data lines in the display device and a portion corresponding to portion A1 in FIG. 2;

DETAILED DESCRIPTION

Figure 1:
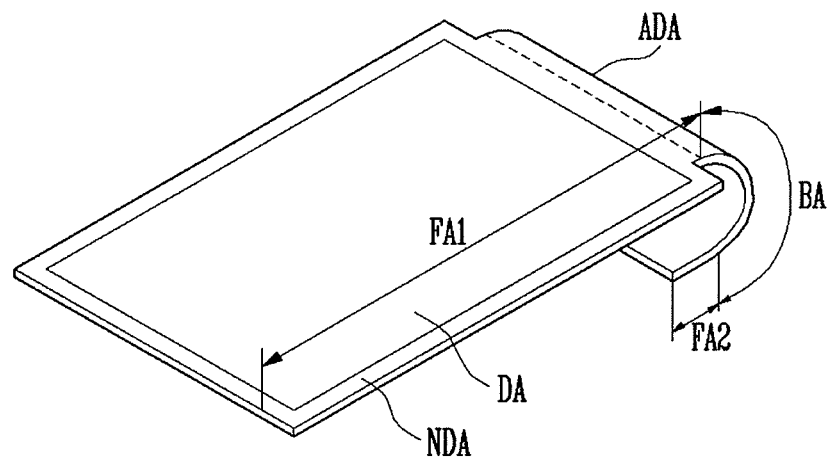
FIG. 1 illustrates an embodiment of a display device.

Example embodiments will be described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments, or certain features thereof, may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
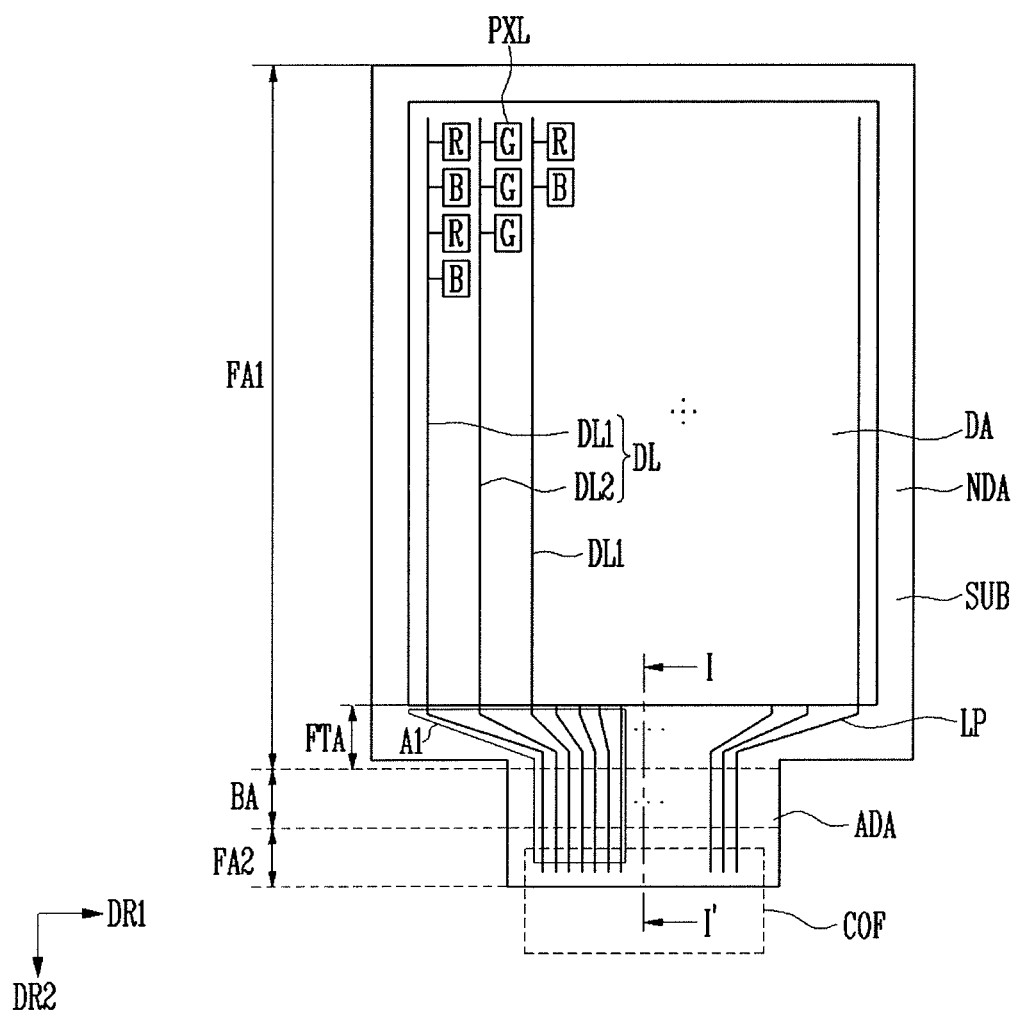
FIG. 2 illustrates another view of the display device in FIG. 1.

FIG. 1 illustrates an embodiment of a display device, and FIG. 2 illustrates an embodiment of another view of the display device in FIG. 1. Referring to FIGS. 1 and 2, the display device includes a substrate SUB, pixels PXL provided on the substrate SUB, and a line part LP. The substrate SUB includes a display area DA, and a non-display area NDA on at least one side of the display area DA.

In an embodiment, the substrate SUB may include a pair of short sides which are parallel with each other in a first direction DR1, and a pair of long sides which are parallel with each other in a second direction DR2. The substrate SUB has a predetermined shape Examples include approximately a quadrangular (e.g., rectangular) shape, a closed polygon including linear sides, a circle, an ellipse, or the like, or a shape including a side formed of a curved line, and a semicircle, a semi-ellipse or the like, or a shape including sides formed of a linear line and a curved line.

In an embodiment, in the case where the substrate SUB has a side formed of a linear line, at least some of corners of each shape may be formed of a curved line. For instance, when the substrate SUB has a rectangular shape, each of the junctions between adjacent linear sides is replaced with a curved line having a predetermined curvature. For example, each of the vertices may be formed of a curved side, which has a predetermined curvature, and opposite ends of which are respectively coupled to two adjacent linear lines. The curvature may vary depending on the position. For example, the curvature may vary depending on a start point of the curved line, the length of the curved line, etc.

The display area DA includes a plurality of pixels PXL for displaying an image. The display area DA may have a shape corresponding to the shape of the substrate SUB. For example, in the same manner as the shape of the substrate SUB, the display area DA may have various shapes, e.g., a closed polygon including linear sides, a circle, an ellipse or the like, a shape including a side formed of a curved line, a semicircle, a semi-ellipse or the like, or a shape including sides formed of a linear line and a curved line. In an embodiment, when the display area DA has a side formed of a linear line, at least some of corners of each shape may be formed of a curved line.

The pixels PXL in the display area DA of the substrate SUB. Each pixel PXL may correspond to a smallest unit for displaying light of an image. The pixels PXL may emit white light and/or color light. For example, each pixel PXL may emit red, green, and blue light. The pixels PXL may emit cyan, magenta, or yellow light.

Each of the pixels PXL may be a light-emitting element including an organic emission layer. In one embodiment, the pixel PXL may be a liquid crystal element, an electrophoretic element, an electrowetting element, or another type of display element.

In an embodiment, the non-display area NDA may further include an additional area ADA which protrudes from a portion thereof. The additional area ADA may protrude from the sides that define the non-display area NDA. In one embodiment, the additional area ADA may protrude from a side corresponding to one of the short sides of the substrate SUB. In one embodiment, the additional area ADA may protrude from one of the long sides or may protrude from each of two or more sides of the four sides. In an embodiment, a data drive unit may be provided on or coupled to additional area ADA.

In an embodiment, at least portion of the display device may have flexibility, and the display device may be folded at the portion having the flexibility. For example, the display device may include a bent area BA which has flexibility and is folded in one direction, and a flat area FA provided at at least one side of the bent area and is flat without folding. The flat area FA may or may not have flexibility.

In an embodiment, the bent area BA may be in the additional area ADA. According to an embodiment, a first flat area FA1 and a second flat area FA2 may be spaced apart from each other, with the bent area BA therebetween. The first flat area FA1 may include the display area DA. In an embodiment, the bent area BA may be spaced apart from the display area DA.

With regard to the bent area BA, when a line on which the display device is folded refers to a folding line, the folding line is in the bent area BA. The term "fold" may correspond to the case where the display device changes from an original shape to another shape, e.g., one which does not have a fixed shape. This term may included but is not limited to cases where the display device may be folded or curved along a folding line or may be rolled, for example, in a scrolling manner.

In an embodiment, there are two flat areas FA1 and FA2 such that one side of one flat area is parallel with one side of the other flat area, and the display device is folded such that the flat areas FA1 and FA2 face each other. In one embodiment, the two flat areas FA1 and FA2 with the interposing bent area BA may be folded onto each other, with a predetermined angle therebetween (e.g., an acute angle, a right angle or an obtuse angle). In an embodiment, the additional area ADA may be bent along the folding line. In this case, since the additional area ADA is bent, the width of a bezel may be reduced.

Figure 3A:
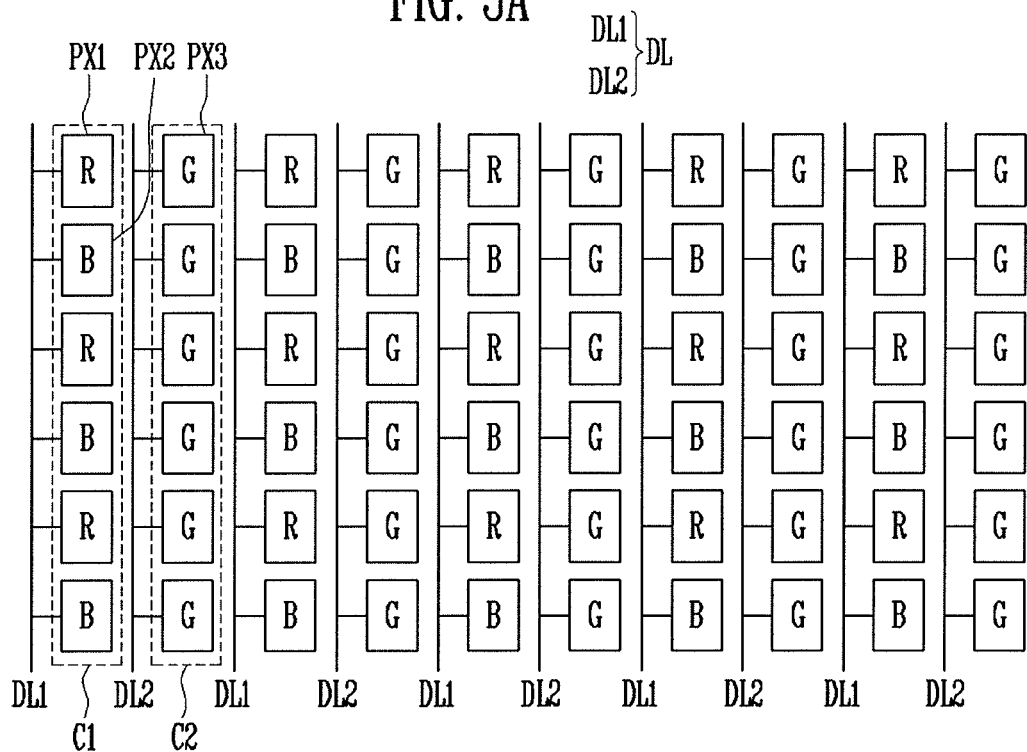
FIGS. 3A and 3B illustrate embodiments of a pixel unit.
Figure 3B:
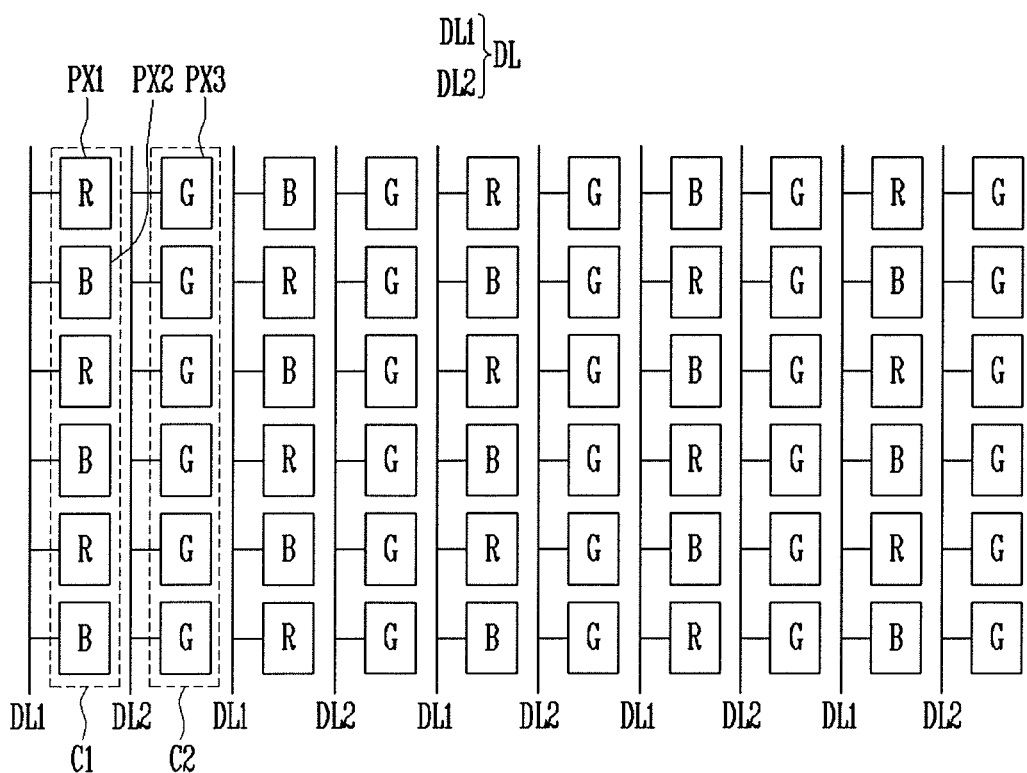

FIGS. 3A and 3B illustrate embodiments of a pixel unit in the display area of the display device. Referring to FIGS. 2, 3A, and 3B, the display device includes a pixel (PXL) unit including a plurality of pixels PXL to display an image.

In an embodiment, the pixels PXL may be arranged in a matrix that includes rows extending in the first direction DR1 and columns extending in the second direction DR2. The pixels PXL may be arranged in various forms. For example, the pixels PXL may be arranged such that one direction of the arrangement corresponds to the row direction, or a direction oblique to the one direction corresponds to the row direction.

The pixels PXL may include first pixels PX1 for displaying light of a first color, second pixels PX2 for displaying light of a second color, and third pixels PX3 for displaying light of a third color. In an embodiment, the first color may be red, the second color may be blue, and the third color may be green. In one embodiment, the first to third colors may be a different combination of colors and/or a white pixel may be included.

The first pixels PX1 and the second pixels PX2 are alternately arranged in a column direction, thus forming a first pixel column C1. The first pixel column C1 may have pixels arranged in a sequence of the first pixel PX1, the second pixel PX2, the first pixel PX1, the second pixel PX2, . . . . The third pixels PXL are arranged in the column direction, thus forming a second pixel column C2. The second pixel column C2 may have pixels arranged in a sequence of the third pixel PX3, the third pixel PX3, . . . .

In an embodiment, the pixel arrangement sequences of adjacent first pixel columns C1 may differ from each other. For example, in one of the adjacent first pixel columns C1, the pixels may be arranged in a sequence of the first pixel PX1, the second pixel PX2, the first pixel PX1, the second pixel PX2, . . . , and so on. In the other first pixel columns C1, the pixels may be arranged in a sequence of the second pixel PX2, the first pixel PX1, the second pixel PX2, the first pixel PX1, . . . , and so on.

Accordingly, in the embodiment of FIG. 3A, the pixels may be arranged along the row direction in a sequence of the first pixel PX1, the third pixel PX3, the first pixel PX1, the third pixel PX3, . . . , or in a sequence of the second pixel PX2, the third pixel PX3, the second pixel PX2, the third pixel PX3, . . . , and so on. In one embodiment, the pixels may be arranged along the row direction in a sequence of the first pixel PX1, the third pixel PX3, the second pixel PX2, the third pixel PX3, . . . , and so on.

A plurality of first pixel columns C1 and a plurality of second pixel columns C2 are provided and alternately arranged in the row direction. Therefore, based on any one row, for example, an arbitrary row, the first pixels PX1 and the third pixels PX3 are alternately arranged on an n-th row. That is, on the n-th row, the pixels are arranged in a sequence of the first pixel PX1, the third pixel PX3, the first pixel PX1, the third pixel PX3, the first pixel PX1, . . . , and so on. On an n−1-th row or n+1-th row, the second pixels PX2 and the third pixels PX3 are alternately arranged. That is, on the n−1-th row or n+1-th row, the pixels are arranged in a sequence of the second pixel PX2, the third pixel PX3, second pixel PX2, third pixel PX3, second pixel PX2, . . . , and so on.

Each pixel column is coupled to a corresponding data line DL. The pixels PXL of the first pixel column C1 are coupled to a first data line DL1. For example, the first pixels PX1 and the second pixels PX2 of the first pixel column C1 are coupled to the first data line DL1. The pixels PXL of the second pixel column C2 are coupled to a second data line DL2. The third pixels PX3 of the second pixel column C2 are coupled to the second data line DL2. Consequently, the first data lines DL1 and the second data lines DL2 are alternately arranged in the row direction in the same manner as that of the first and second pixel columns C1 and C2.

The above-mentioned arrangement structure of the first pixels PX1 to third pixels PX3 corresponds to a PenTile matrix pixel (PXL) structure. The PenTile matrix pixel (PXL) structure, in an embodiment, employs a rendering method of sharing adjacent pixels to represent colors. Thus, a comparatively small number of pixels may realize high resolution.

The first pixels PX1, second pixels PX2, and third pixels PX3 may have the same area. In one embodiment, first pixels PX1, second pixels PX2, and/or third pixels PX3 may have different areas in another embodiment. All of the first pixel PX1s, second pixels PX2, and third pixels PX3 may have different areas, e.g., two of them may have the same area and the other one may have a different area. For example, the area of each second pixel PX2 that emits blue light as a second color may be greater than that of each first pixel PX1 that emits red light as a first color, and/or that of each third pixel PX3 that emits green light as a third color. In one embodiment, the first pixels PX1 and second pixels PX2 may have the same area, and the area of the third pixels PX3 may be less than areas of the first pixels PX1 and/or the second pixels PX2.

Figure 4:
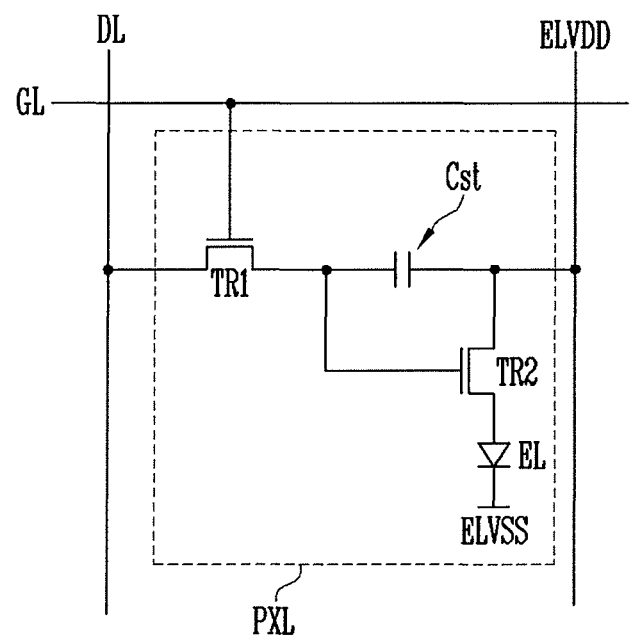
FIG. 4 illustrates a circuit embodiment of the pixel.

FIG. 4 illustrates a circuit embodiment of a pixel PXL that serves as a light-emitting element and which is representative of the structure of the first, second, and third pixels.

Referring to FIG. 4, each pixel PXL includes a thin film transistor coupled to the line part, a light-emitting element EL coupled to the thin film transistor, and a capacitor Cst. The thin film transistor may include a drive thin film transistor TR2 for controlling the light-emitting element EL, and a switching thin film transistor TR1 for switching the drive thin film transistor TR2. The pixel PXL, as illustrated, includes two thin film transistors TR1 and TR2. In one embodiment, each pixel PXL may include one thin transistor and one capacitor, or three or more thin film transistors and two or more capacitors. In one embodiment, the pixel PXL may include seven thin film transistors, one or more light-emitting elements, and one or more storage capacitors.

The switching thin film transistor TR1 includes a gate electrode, a source electrode, and a drain electrode. In the switching thin film transistor TR1, the gate electrode is coupled to a gate line GL, and the source electrode is coupled to the data line DL. The drain electrode is coupled to a gate electrode of the drive thin film transistor TR2. The switching thin film transistor TR1 transmits a data signal applied to the data line DL to the drive thin film transistor TR2 in response to a scan signal applied to the gate line GL.

The drive thin film transistor TR2 includes a gate electrode, a source electrode, and a drain electrode. In the drive thin film transistor TR2, the gate electrode is coupled to the switching thin film transistor TR1, the source electrode is coupled to a first power line ELVDD, and the drain electrode is coupled to the light-emitting element EL.

The light-emitting element EL includes a light-emitting layer between a first electrode and a second electrode. The first electrode is coupled to the drain electrode of the drive thin film transistor TR2. The second electrode is coupled to a second power line ELVSS to receive a common voltage. The light-emitting layer displays an image by emitting light based on an output signal of the drive thin film transistor TR2. In this regard, light emitted from the light-emitting layer may be changed depending on the material of the light-emitting layer, and may be color light or white light.

The capacitor Cst is coupled between the gate electrode and the source electrode of the drive thin film transistor TR2, and charges and stores a data signal to control the gate electrode voltage of the drive thin film transistor TR2.

Referring again to FIGS. 1 to 4, the non-display area NDA is an area does not include pixels and thus does not display an image. The non-display area NDA may include a fan-out area FTA between the display area DA and bent area BA. The display DA, the fan-out area FTA, and the bent area BA may be successively arranged.

The fan-out area FTA is a part on which the line part of the display area DA extends to the bent area BA. The lines extending in the second direction DR2 in the display area DA are in a fan form, in which intervals between the lines are gradually reduced in the fan-out area FTA. The ling part may include various kinds of lines. For example, the line part LP may provide a signal to each pixel PXL and may include a gate line, a data line, a first power line, a second power line, and so on. The line part LP may optionally include other lines. In an embodiment, there will be described an example in which the lines of the line part are data lines.

In an embodiment, the data lines DL may generally extend in the second direction DR2 in the display area DA and be spaced apart from each other. As the data lines DL extend in the second direction DR2, the distance between adjacent data lines DL may be gradually reduced or increased. In an embodiment, the data lines DL may be configured such that the distance between adjacent data lines DL is gradually reduced in the second direction DR2 in the fan-out area FTA.

The non-display area NDA may include data lines DL coupled to the pixels PXL and a drive unit coupled to the data lines DL to drive the pixels PXL. The data lines DL may be coupled to the pixels PXL. The data lines DL may be provided over the display area DA and the non-display area NDA. In one embodiment, the data lines DL may extend to the second flat area FA2 via the fan-out area FTA of non-display area NDA.

The data lines DL are coupled to the drive unit, and the drive unit may be coupled to an end of the line part. The drive unit provides a signal to each pixel PXL through the corresponding data line DL and controls the drive of each pixel PXL according to the signal.

The drive unit may include a scan drive unit which provides a scan signal to each pixel PXL along the corresponding gate line GL, a data drive unit which provides a data signal to each pixel PXL along the corresponding data line DL, and a timing control unit which controls the scan drive unit and the data drive unit.

In an embodiment, the scan drive unit may be directly mounted on the substrate SUB. When the scan drive unit is directly mounted on the substrate SUB, the scan drive unit may be formed during a process of forming the pixels PXL. In one embodiment, the scan drive unit may be on the substrate SUB in a chip-on-glass form after it has been formed on a separate chip. In one embodiment, the scan drive unit may be mounted on a printed circuit board and then coupled to the substrate SUB by a connector.

In an embodiment, the data drive unit may be directly mounted on the substrate SUB, or may be formed on a separate chip and then coupled to the substrate SUB. According to an embodiment, when the data drive unit is formed on a separate chip and coupled to the substrate SUB, it may be provided in a chip-on-glass or chip-on-plastic form. In one embodiment, the data drive unit may be mounted on a printed circuit board and then coupled to the substrate SUB by a connector. In an embodiment, the data drive unit may be manufactured in a chip-on-film (COF) form and then coupled to the substrate SUB.

Figure 5:
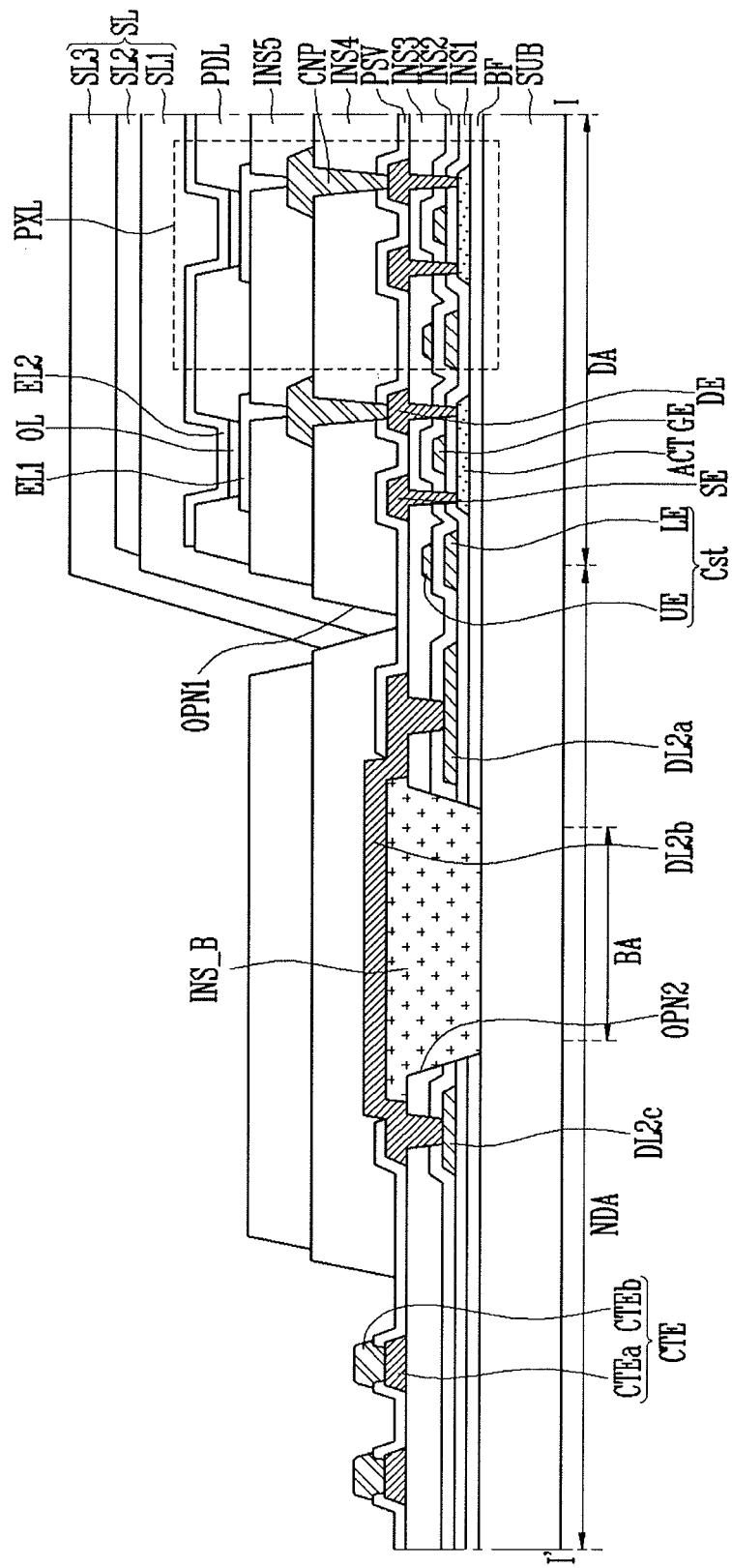
FIG. 5 illustrates s view taken along section line I-I' in FIG. 2 which includes a portion of a pixel of a display area and a non-display area.

FIG. 5 illustrates a cross-sectional view taken along line I-I' in FIG. 2, and illustrates a portion of a pixel of the display area DA and the non-display area NDA. In an embodiment, as illustrated in FIG. 1, the display device has a shape in which a portion thereof is bent. In FIG. 5, the display device is shown in an unbent state. The display area DA will be first described, and then the non-display area NDA will be described.

In an embodiment, a plurality of pixels PXL are in the display area DA. Each pixel PXL includes a transistor coupled to a corresponding line of the line part LP, a light-emitting element coupled to the transistor, and a capacitor Cst. The transistor may include a drive transistor for controlling the light-emitting element, and a switching transistor for switching the drive transistor.

In FIG. 3, two transistors and one capacitor are illustrated for each pixel PXL. In one embodiment, two or more transistors and at least one capacitor may be provided for each pixel PXL. In another embodiment, three or more transistors and two or more capacitors may be provided for each pixel PXL.

The pixels PXL according to an embodiment are provided on the substrate SUB. The substrate SUB may be made of, for example, insulating material such as resin. Furthermore, the substrate SUB may be made of material having flexibility so as to be bendable or foldable, and have a single layer or multilayer structure.

The substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or polyurethane. The material constituting the substrate SUB may be different in another embodiment, and the substrate SUB may also be made of fiber reinforce plastic (FRP) or the like.

A buffer layer BF is on the substrate SUB. The buffer layer BF functions to prevent impurities from diffusing into the switching transistor or the drive transistor. The buffer layer BF may be provided in a single-layer structure or a multilayer structure having at least two or more layers The buffer layer BF may be an inorganic insulating layer formed of inorganic material. For example, the buffer layer BF may include silicon nitride, silicon oxide, silicon oxynitride, or the like. In the case where the buffer layer BF has a multilayer structure, the respective layers may be formed of the same material or different materials. The buffer layer BF may be omitted depending on the material of the substrate SUB or processing conditions.

Active patterns ACT are on the buffer layer BF. Each active pattern ACT includes a semiconductor material. Each active pattern ACT may include a channel region between a source region and a drain region. The active pattern ACT may be a semiconductor pattern including, for example, polysilicon, amorphous silicon, or an oxide semiconductor. The channel region may be an impurity-undoped semiconductor pattern and an intrinsic semiconductor. Each of the source region and the drain region may be a semiconductor pattern doped with an impurity. An impurity such as an n-type impurity, a p-type impurity, or other metals may be used as the impurity.

A first insulating layer INS1 is on the active pattern ACT. The first insulating layer INS1 may be an inorganic insulating layer formed of inorganic material or an organic insulating layer formed of organic material. Inorganic insulating material, such as polysiloxane, silicon nitride, silicon oxide, or silicon oxynitride, may be used as the inorganic material. The organic material may be organic insulating material such as but not limited to a polyacryl compound, a polyimide compound, a fluorocarbon compound such as Teflon, or a benzocyclobutene compound.

A gate electrode GE and a lower capacitor electrode LE are on the first insulating layer INS1. The gate electrode GE covers a region corresponding to the channel region of the active pattern ACT. The gate electrode GE and the lower capacitor electrode LE may be made of metal. For example, the gate electrode GE may include at least one metal such as gold (Au), silver (Ag), aluminum (Al), molybdenum (Mo), chrome (Cr), titanium (Ti), nickel (Ni), neodymium (Nd), copper (Cu), or an alloy of the metals. The gate electrode GE may have a single-layer structure, or a multilayer structure formed by stacking two or more materials of metals and alloys.

In an embodiment, other lines including gate lines may be in the same layer as that of the gate electrode GE and the lower capacitor electrode LE and formed of the same material as them. Other lines such as the gate lines may be directly or indirectly coupled to a portion of the transistor, e.g., the gate electrode GE, in each pixel PXL.

A second insulating layer INS2 is on the gate electrode GE and the lower capacitor electrode LE. The second insulating layer INS2 may be an inorganic insulating layer formed of inorganic material. Polysiloxane, silicon nitride, silicon oxide, silicon oxynitride, or the like, may be the inorganic material.

An upper capacitor electrode UE is on the second insulating layer INS2 and may be formed of metal. For example, the upper capacitor electrode UE may include at least one of metals such as gold (Au), silver (Ag), aluminum (Al), molybdenum (Mo), chrome (Cr), titanium (Ti), nickel (Ni), neodymium (Nd), copper (Cu), or an alloy of the metals. The upper capacitor electrode UE may have a single-layer structure or a multilayer structure formed by stacking two or more materials of metals and alloys.

The second insulating layer INS2 is between the lower capacitor electrode LE and the upper capacitor electrode UE, thus forming the capacitor Cst. The capacitor Cst may have different structure in another embodiment.

A third insulating layer INS3 is on the upper capacitor electrode UE and may be an inorganic insulating layer formed of inorganic material. Polysiloxane, silicon nitride, silicon oxide, silicon oxynitride, or the like, may be the inorganic material.

A source electrode SE and a drain electrode DE are on the third insulating layer INS3. The source electrode SE and the drain electrode DE respectively come into contact with the source region and the drain region of the active pattern ACT through contact holes that are formed in the third insulating layer INS3, the second insulating layer INS2, and the first insulating layer INS1.

The source electrode SE and the drain electrode DE may be made of metal, e.g., at least one metal such as gold (Au), silver (Ag), aluminum (Al), molybdenum (Mo), chrome (Cr), titanium (Ti), nickel (Ni), neodymium (Nd), copper (Cu), or an alloy of the metals. Each of the source electrode SE and the drain electrode DE may have a single-layer structure or a multilayer structure formed by stacking two or more materials of metals and alloys.

In an embodiment, the data lines DL or first power lines may be in the same layer as that of the source electrode SE and the drain electrode DE and formed of the same material as them. The data lines DL or the first power lines may be directly or indirectly coupled to a portion (e.g., the source electrode SE and/or the drain electrode DE) of the transistor in each pixel PXL.

A passivation layer PSV may be on the source electrode SE and the drain electrode DE. The passivation layer PSV may be an inorganic insulating layer formed of inorganic material. For example, polysiloxane, silicon nitride, silicon oxide, silicon oxynitride, or the like, may be used as the inorganic material. The passivation layer PSV may be omitted in one or more embodiments.

A fourth insulating layer INS4 may be on the passivation layer PSV. In one embodiment, the passivation layer PSV may be omitted. In this case, the fourth insulating layer INS4 may be on the third insulating layer INS3.

The fourth insulating layer INS4 may be an organic insulating layer formed of organic material. An organic insulating material such as a polyacryl compound, a polyimide compound, a fluorocarbon compound such as Teflon, or a benzocyclobutene compound may be used as the organic material.

A connection pattern CNP may be on the fourth insulating layer INS4. The connection pattern CNP is coupled to the drain electrode DE through a contact hole that passes through the fourth insulating layer INS4 and the passivation layer PSV. The connection pattern CNP may include at least one metal such as gold (Au), silver (Ag), aluminum (Al), molybdenum (Mo), chrome (Cr), titanium (Ti), nickel (Ni), neodymium (Nd), copper (Cu), or an alloy of the metals. The connection pattern CNP may have a single-layer structure or a multilayer structure formed by stacking two or more materials of metals and alloys.

In an embodiment, other lines such as a dummy power line may be in the same layer as that of the connection pattern CNP and formed of the same material as that of the connection pattern CNP.

A fifth insulating layer INS5 may be on the connection pattern CNP and may include an organic insulating layer formed of organic material. An organic insulating material (e.g., a polyacryl compound, a polyimide compound, a fluorocarbon compound such as Teflon, or a benzocyclobutene compound) may be the organic material.

A first electrode EL1 may be on the fifth insulating layer INS5. The first electrode EL1 is coupled to the transistor in such a way that the first electrode EL1 is coupled to the connection pattern CNP through a contact hole passing through the fifth insulating layer INS5 and coupled to the drain electrode DE through a contact hole passing through the fourth insulating layer INS4 and the passivation layer PSV. The first electrode EL1 may be used as an anode or a cathode.

In an embodiment, the organic insulating layer formed of the fourth insulating layer INS4 and the fifth insulating layer INS5 may be on the passivation layer PSV. In one embodiment, only one organic insulation layer may be between the passivation layer PSV and the first electrode EL1. In an embodiment, only one organic insulating layer may be on the passivation layer PSV, and the first electrode EL1 may be on the organic insulating layer. In this case, the connection pattern CNP may be omitted, and the first electrode EL1 may be directly coupled to the drain electrode DE through a contact hole in the organic insulating layer. When there is described an embodiment in which the organic insulating layer is formed of two layers including the fourth insulating layer INS4 and the fifth insulating layer INS5, this may include the case where the organic insulating layer is divided into the fourth insulating layer INS4 and the fifth insulating layer INS5 or the case where only one organic insulating layer is provided.

The first electrode EL1 may include a layer of metal, e.g., Ag, Mg, Al, Pt, Pd, Au, Ni, Nd, Ir, Cr, or an alloy of them, and/or ITO (indium tin oxide), IZO (indium zinc oxide), ZnO (zinc oxide), ITZO (indium tin zinc oxide), or the like. In an embodiment, the first electrode EL1 may be formed of one kind of metal or two or more kinds of metals, e.g., an alloy of Ag and Mg. The first electrode EL1 may be include a transparent conductive layer to provide an image in a direction toward a lower portion of the substrate SUB, or may include a metal reflective layer and/or a transparent conductive layer to provide an image in a direction toward an upper portion of the substrate SUB.

A pixel defining layer PDL for defining a pixel (PXL) region corresponding to each pixel PXL is on the substrate SUB on which the first electrode EL1, etc. are formed. The pixel defining layer PDL is an organic insulating layer including, for example, a polyacryl compound, a polyimide compound, a fluorocarbon compound such as Teflon, or a benzocyclobutene compound may be used as the organic material.

The pixel defining layer PDL exposes an upper surface of the first electrode EL1 and protrudes from the substrate SUB along the periphery of the pixel PXL.

An organic light-emitting layer OL may be provided on the pixel (PXL) region enclosed by the pixel defining layer PDL. The organic light-emitting layer OL may include low-molecular or high molecular material. The low-molecular material may include, for example, copper phthalocyanine (CuPc), N,N'-Di(naphthalene-1-yl)-N,N'-diphenyl-benzidine (NPB), tris-8-hydroxyquinoline aluminum (Alq3), etc. Such materials may be formed by a vacuum evaporation method. The high-molecular material may include, for example, PEDOT, PPV (poly-phenylenevinylene) material, polyfluorene material, etc.

The organic light-emitting layer OL may have a single-layer structure or a multilayer structure including various functional layers. When the organic light-emitting layer OL has a multilayer structure, the structure may include all or a portion of a hole injection layer, a hole transport layer, an emission layer, an electron transport layer, an electron injection layer, etc., may be stacked in a single-material or multi-material structure. The organic light-emitting layer OL may be formed, for example, by an evaporation method, a screen printing method, an inkjet printing method, a laser induced thermal imaging (LITI) method, or the like.

In one embodiment, at least a portion of the organic light-emitting layer OL may be integrally formed over a plurality of first electrodes EL1. In one embodiment, the organic light-emitting layer OL may be individually provided to correspond to each of the first electrodes EL1.

A second electrode EL2 is on the organic light-emitting layer OL and, for example, may be provided for each pixel PXL. In one embodiment, the second electrode EL2 may cover most of the display area DA and may be shared by multiple pixels PXL.

The second electrode EL2 may serve as an anode or a cathode. When the first electrode EL1 is an anode, the second electrode EL2 may be a cathode. When the first electrode EL1 is a cathode, the second electrode EL2 may be an anode.

The second electrode EL2 may include a metal layer including, for example, Ag, Mg, Al, Pt, Pd, Au, Ni, Nd, Ir, Cr, or the like, and/or a transparent conductive layer including, for example, ITO (indium tin oxide), IZO (indium zinc oxide), ZnO (zinc oxide), ITZO (indium tin zinc oxide), or the like. In an embodiment, the second electrode EL2 may have a multilayer structure with two or more layers including a thin metal layer. In one embodiment, the second electrode EL2 may have a triple-layer structure of, for example, ITO/Ag/ITO.

The second electrode EL2 may include a metal reflective layer and/or a transparent conductive layer when an image is to be provided in a direction toward the lower portion of substrate SUB, and may include a transparent conductive layer when an image is to be provided in a direction toward the upper portion of substrate SUB.

An encapsulation layer SL is on the second electrode EL2 and may be formed of a single layer or multiple layers. In an embodiment, the encapsulation layer SL may include first to third encapsulation layers SL1 to SL3. The first to third encapsulation layers SL1 to SL3 may include an organic material and/or inorganic material. In one embodiment, the third encapsulation layer SL3 may be made of inorganic material at the outermost position.

In an embodiment, the first encapsulation layer SL1 may include inorganic material, the second encapsulation layer SL2 may include an organic material or inorganic material, and the third encapsulation layer SL3 may include an inorganic material. In the case of an inorganic material, the resistance to penetration of water or oxygen is superior compared to that of the organic material, but the inorganic material is prone to cracking because it has low flexibility. Since the first encapsulation layer SL1 and the third encapsulation layer SL3 are made of inorganic material, and the second encapsulation layer SL2 is made of organic material, the spread of cracks may be prevented. When the second encapsulation layer SL2 includes organic material, it may be fully covered with the third encapsulation layer SL3 so that an edge of the second encapsulation layer SL2 is prevented from being externally exposed.

In an embodiment, the organic material may include an organic insulating material, e.g., a polyacryl compound, a polyimide compound, a fluorocarbon compound such as Teflon, or a benzocyclobutene compound. Polysiloxane, silicon nitride, silicon oxide, silicon oxynitride, or the like, may be used as the inorganic material. When the second encapsulation layer SL2 includes inorganic material in lieu of organic material, various silicon insulating materials may be used, e.g., hexamethyldisiloxane (HMDSO), octamethylcyclotetrasiloxane (OMCTSO), tetramethyldisiloxane (TMDSO), tetraethyleorthosilicate (TEOS), etc. In an embodiment, the organic light-emitting layer OL that forms a light-emitting element may be easily damaged by water, oxygen, etc., from the outside. Given this, the encapsulation layer SL covers the organic light-emitting layers OL, thus protecting them. The encapsulation layer SL may cover the display area DA and extend to the outside of the display area DA.

When the insulating layers include an organic material, there are advantages in aspects of flexibility, elasticity, etc., but water or oxygen may penetrate compared to when the insulation layer is made of inorganic material. In an embodiment, in order to prevent water or oxygen from penetrating into the insulating layers made of organic material, the insulating layers including organic material may be covered with the insulating layers including inorganic material so that edges of the insulating layers made of organic material are not exposed to the outside.

For example, the fourth insulating layer INS4, the fifth insulating layer INS5, and/or the pixel defining layer PDL may be made of organic material that extends to only a portion of the non-display area NDA, rather than covering the entirety of the non-display area NDA. The fourth insulating layer INS4, the fifth insulating layer INS5, and/or the pixel defining layer PDL that include organic material may have a first opening OPN1 formed, for example, by removing a portion thereof along the perimeter of the display area DA.

In an embodiment, an upper surface of the pixel defining layer PDL, and a side surface of the fourth insulating layer INS4, the fifth insulating layer INS5, and/or the pixel defining layer PDL exposed by formation of first opening OPN1 are encapsulated by an insulating layer including organic material (for example, by the encapsulation layer SL), and thus is prevented from being exposed to the outside. In one embodiment, the encapsulation layer SL may include a plurality of organic material layers and a plurality of inorganic material layers that are alternately stacked.

In an embodiment, the line part LP is in the non-display area NDA. The non-display area NDA has therein the bent area BA at which the substrate SUB is bent. The line part LP includes the data lines DL and couple the drive unit and the pixels PXL.

The data lines DL according to an embodiment may couple the pixels PXL and the drive unit. For this, the data lines DL may extend from the pixels PXL approximately in the second direction DR2. The data lines DL may extend to an end of the additional area ADA with respect to the second direction DR2. Contact electrodes CTE may be provided on ends of the data lines DL. The pixels PXL may be coupled, through the contact electrodes CTE coupled to the data lines DL, to the drive unit that is embodied in a chip-on-film form or the like.

The data lines DL include first data lines DL1 and second data lines DL2. The first data lines DL1 may include first pixel-unit data lines DL1 in the display area DA, first fan-out lines which are provided in the fan-out area FTA, and first link lines which are provided in the bent area BA. The second data lines DL2 may include second pixel-unit data lines DL2$a$ in the display area DA, second fan-out lines DL2$b$ in the fan-out area FTA, and second link lines DL2$c$ in the bent area BA. In FIG. 5, among the data lines DL, a second pixel-unit data line DL2$a$, a second fan-out line DL2$b$, and a second link line DL2$c$ are illustrated.

The buffer layer BF is on the non-display area NDA of the substrate SUB. The first to fourth insulating layers INS1 to INS4 are successively provided on the buffer layer BF.

A second opening OPN2 is in the insulating layers in the bent area BA. The bent area BA is an area at which substrate SUB is bent. For example, second opening OPN2 may be in the buffer layer BF, the first insulating layer INS1, the second insulating layer INS2, and the third insulating layer INS3 by removing portions thereof corresponding to the bent area BA. In some of the buffer layer BF, the first insulating layer INS1, the second insulating layer INS2 and the third insulating layer INS3, portions thereof corresponding to the bent area BA may not be removed. For example, in the buffer layer BF, a portion thereof corresponding to the bent area BA may not be removed, and the other insulating layers (e.g., the first insulating layer INS1, the second insulating layer INS2 and the third insulating layer INS3) may be formed such that portions thereof corresponding to the bent area BA are removed to form the second opening OPN2.

The phrase "the second opening OPN2 corresponds to the bent area BA" refers to that the second opening OPN2 overlaps the bent area BA. The area of the opening OPN may be greater than that of the bent area BA. In an embodiment, the width of the second opening OPN2 is illustrated as being larger than that of the bent area BA. In one embodiment, the width of the second opening OPN2 may be the same as that of the bent area BA or may be different from the illustrated width.

In FIG. 5, inner side surfaces of the buffer layer BF, the first insulating layer INS1, the second insulating layer INS2, and the third insulating layer INS3 are aligned with each other and are on a linear line. For example, the second opening OPN2 of the third insulating layer INS3 may have an area greater than that the second opening OPN2 of the buffer layer BF. In an embodiment, the second opening OPN2 of the buffer BF may have the smallest area among the second opening OPN2 of the first insulating layer INS1, the second opening OPN2 of the second insulating layer INS2, and the opening OPN2 of the third insulating layer INS3.

A bent-part insulating layer INS_B is in the second opening OPN2. At least a portion of the second opening OPN2 is filled with the bent-part insulating layer INS_B. In FIG. 5, an example in which the second opening OPN2 is completely filled with the bent-part insulating layer INS_B. In an embodiment, the bent-part insulating layer INS_B may fill the second opening OPN2 and, simultaneously, cover a portion of an upper surface of the third insulating layer INS3 corresponding to an area adjacent to the second opening OPN2, e.g., the first and/or second flat areas FA1 and FA2.

The bent-part insulating layer INS_B may be an organic insulating layer made of organic material. Organic insulating material such as a polyacryl compound, a polyimide compound, a fluorocarbon compound such as Teflon, or a benzocyclobutene compound may be used as the organic material.

In FIG. 5, the display device is in an unbent state. In one embodiment, the display device may be bent on the bent area BA. For example, the display device may be manufactured in a flat shape and thereafter may be bent.

In an embodiment, the bent area BA is disposed within a portion from which the inorganic insulating layers have been removed. In one embodiment, the bent area BA may match the portion from which the inorganic insulating layers have been removed. For example, although the bent area BA generally corresponds to the portion from which the insulating layers have been removed, the bent area BA may be equal to or wider or narrower than the portion from which the insulating layers have been removed. Furthermore, in an embodiment, the bent area BA is on only the non-display area NDA. In one embodiment, the bent area BA may be over both the non-display area NDA and the display area DA, or in the display area DA.

The passivation layer PSV may be on the substrate SUB. The passivation layer PSV may be an inorganic insulating layer. In this regard, the passivation layer PSV is not in a region corresponding to the bent area BA, in the same manner as that of the above-mentioned insulating layers (buffer layer BF, first insulating layer INSE second insulating layer INS2, and/or third insulating layer INS3). In addition, the passivation layer PSV exposes a portion of an upper surface of a lower contact electrode CTEa.

The fourth insulating layer INS4 may be on the passivation layer PSV. The fifth insulating layer INS5 may be on the fourth insulating layer INS4. The first opening OPN1 is in the fourth insulating layer INS4 and the fifth insulating layer INS5 by removing portions thereof along the perimeter of the display area DA. Consequently, the fourth insulating layer INS4 and the fifth insulating layer INS5 do not continuously extend from the display area DA to the non-display area NDA.

As described above, the side surfaces of the fourth insulating inlayer INS4 and the fifth insulating layer INS5 in the display area DA are covered with the encapsulation layer SL. However, an upper surface of the fifth insulating layer INS5 that is in the non-display area NDA, and side surfaces of the fourth insulating layer INS4 and the fifth insulating layer INS5 that are in the non-display area NDA, may be at least partially exposed to the outside without the entirety thereof covering the encapsulation layer SL.

The lower contact electrode CTEa may be on the third insulating layer INS3. An upper contact electrode CTEb may be on the lower contact electrode CTEa. The upper contact electrode CTEb may be formed using the same material as that of the connection pattern CNP of the display area DA through the same process. The lower contact electrode CTEa and the upper contact electrode CTEb constitute a contact electrode CTE, and the lines may be coupled to the drive unit embodied in a chip-on-film or printed circuit board form or the like.

Figure 6:
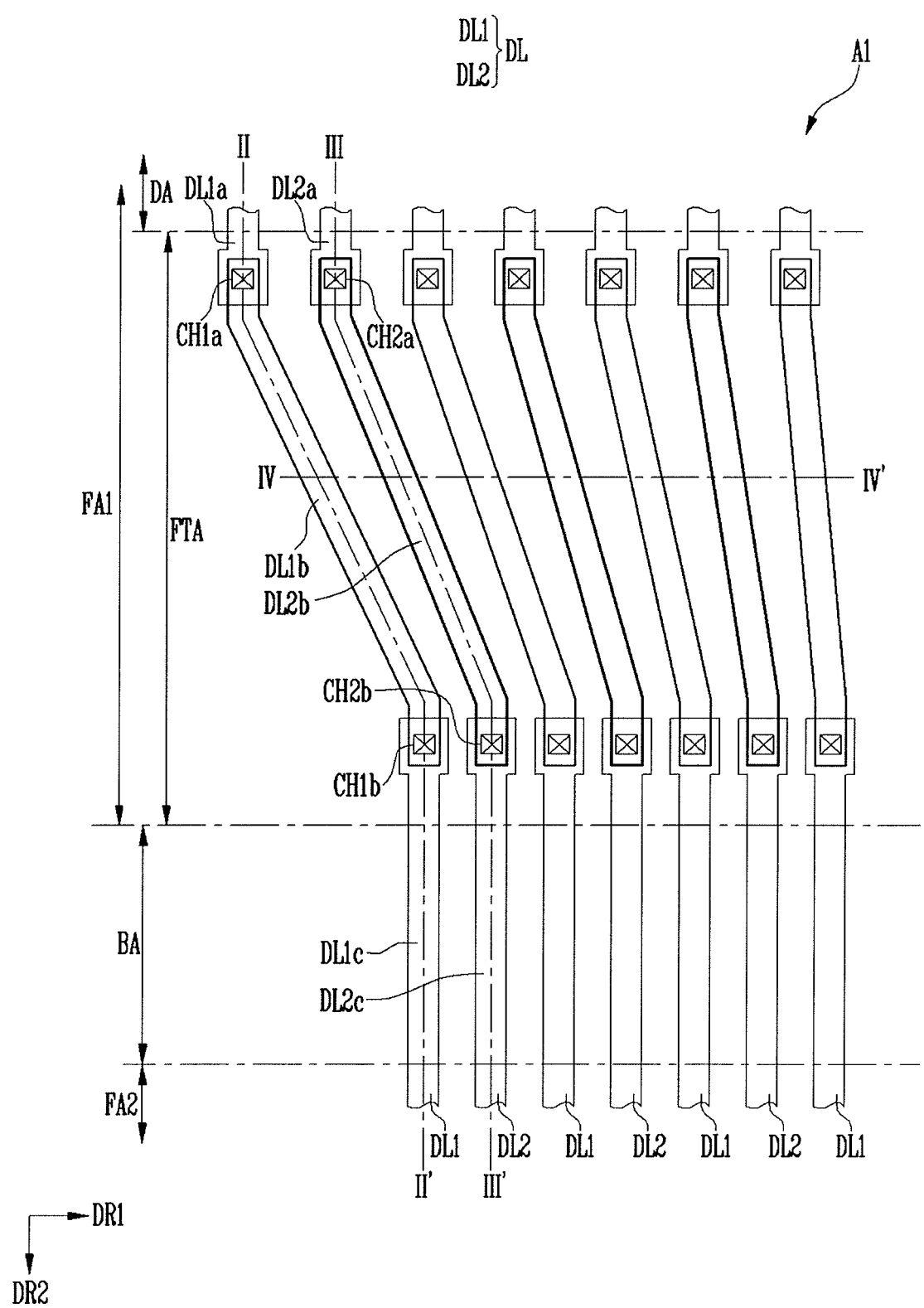
FIG. 6 illustrates an embodiment which includes data lines in the display device and a portion corresponding to portion A1 in FIG. 2.
Figure 7A:
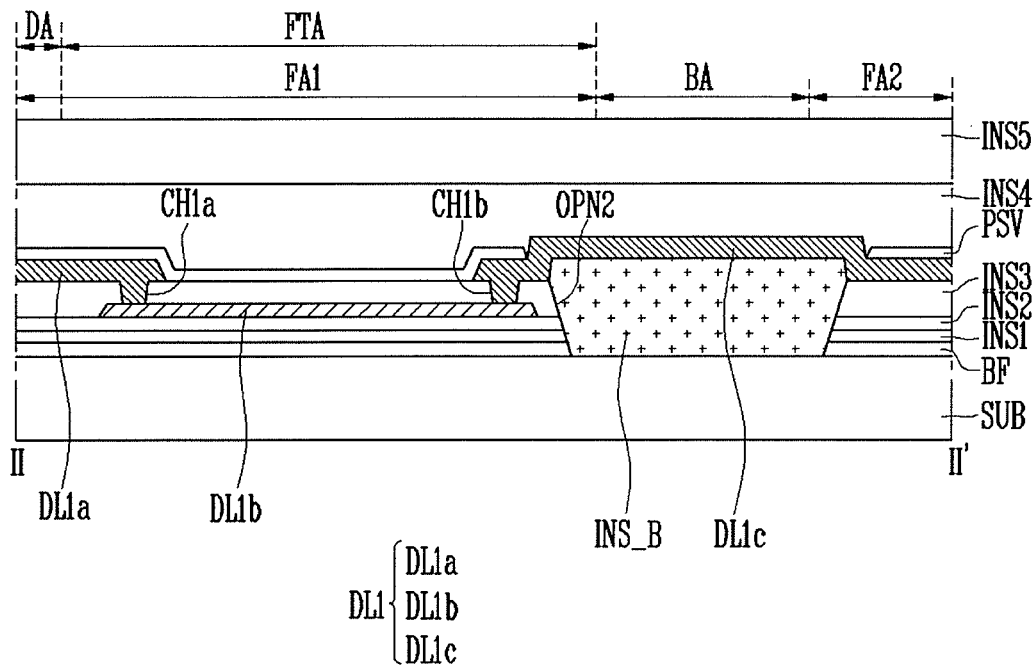
FIG. 7A illustrates a view taken along section line II-II' in FIG. 6.
Figure 7B:
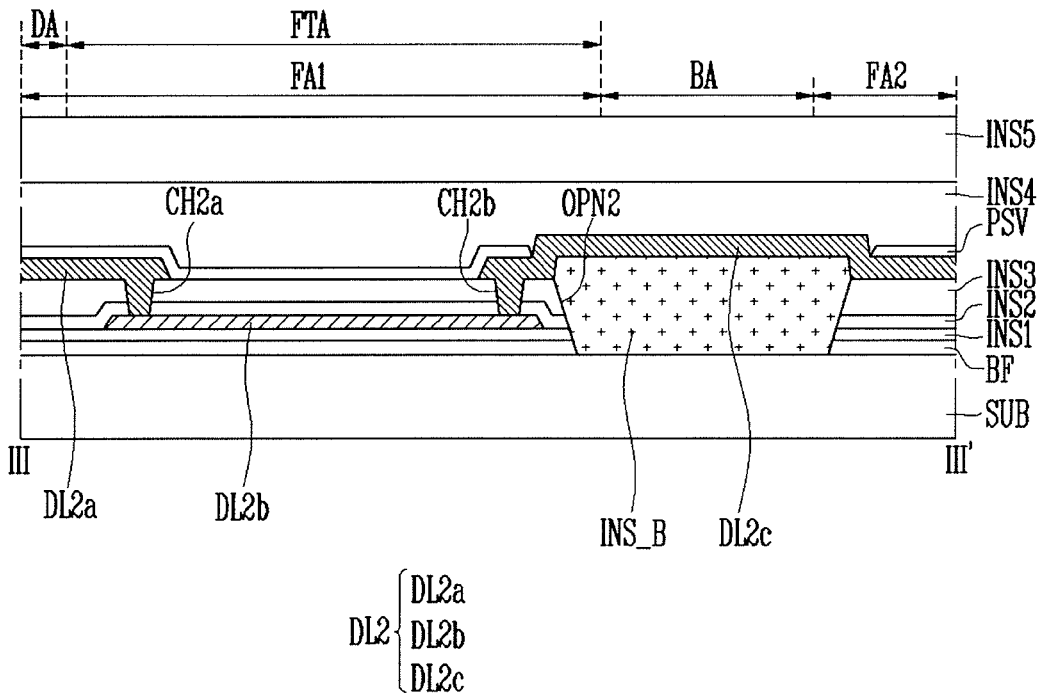
FIG. 7B illustrates a view taken along line section in FIG. 6.
Figure 7C:
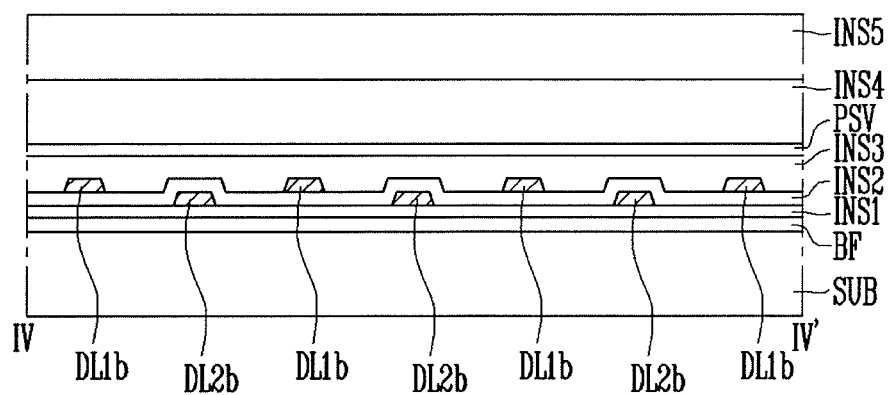
FIG. 7C illustrates a view taken along section line IV-IV' in FIG. 6.

FIG. 6 illustrating an embodiment of a portion corresponding to portion A1 of FIG. 2. FIG. 7A illustrates a sectional view taken along line II-II' in FIG. 6. FIG. 7B illustrates a sectional view taken along line III-III' in FIG. 6. FIG. 7C illustrates a sectional view taken along line IV-IV' in FIG. 6.

Referring to FIGS. 6 and 7A to 7C, the data lines DL include the first data line DL1 coupled to the first pixel column, and the second data line DL2 coupled to the second pixel column. The first pixel column may include the first pixels of the first color and the second pixels of the second color. The second pixel column may include the third pixels of the third color. In an embodiment, the first color may be red and the second color may be blue. Thus, the first data line DL1 may be coupled to red pixels and the blue pixels. In an embodiment, the third color may be green. Consequently, the second data line DL2 may be coupled to green pixels.

The first data line DL1 and the second data line DL2 on the plan view will be described with reference to FIG. 6, and then the first data line DL1 and the second data line DL2 on the sectional views will be described with reference to FIGS. 7A to 7C.

Referring to FIG. 6, the first data line DL1 and the second data line DL2 respectively comprise a plurality of first data lines DL1 and a plurality of second data lines DL2. The first and second data lines DL1 and DL2 are alternately arranged in the first direction DR1.

In the display area DA, the first data lines DL1 and the second data lines DL2 extend in the second direction D2. In the fan-out area FTA, the first data lines DL1, and the second data lines DL2 extend approximately in the second direction D2. The distance between adjacent data lines DL is gradually reduced in the second direction D2. In the bent area BA, the first data lines DL1 and the second data lines DL2 extend in the second direction D2. The distance between adjacent first and second data lines DL1 and DL2 in the bent area BA is less than that in the display area DA.

Each first data line DL1 includes a first pixel-unit data line DL1a in the display area DA, a first fan-out line DL1b in the fan-out area FTA, and a first link line DL1c in the bent area BA. The first pixel-unit data line DL1a is coupled to the first fan-out line DL1b. The first fan-out line DL1b is coupled to the first link line DL1c. The first link line DL1c is coupled to the drive unit through a contact electrode or the like.

An end of the first pixel-unit data line DL1a and an end of the first fan-out line DL1b overlap each other and are coupled to each other through a first contact hole CH1a. The overlapping portion between the first pixel-unit data line DL1a and the first fan-out line DL1b may be in the fan-out area FTA. In another embodiment, the position of the overlapping portion between the first pixel-unit data line DL1a and first fan-out line DL1b may be different, e.g., at least a portion thereof may be in display area DA.

An end of the first fan-out line DL1b and an end of the first link line DL1c are coupled to each other through a second contact hole CH1b. The overlapping portion between the first fan-out line DL1b and the first link line DL1c may be in the fan-out area FTA. The position of the overlapping portion between the first fan-out line DL1b and the first link line DL1c may be different in another embodiment, e.g., at least a portion thereof may be in the bent area BA.

Each second data line DL2 includes a second pixel-unit data line DL2a in the display area DA, a second fan-out line DL2b in the fan-out area FTA, and a second link line DL2c in the bent area BA. The second pixel-unit data line DL2a is coupled to the second fan-out line DL2b. The second fan-out line DL2b is coupled to the second link line DL2c. The second link line DL2c is coupled to the drive unit through a contact electrode or the like.

An end of the second pixel-unit data line DL2a and an end of the second fan-out line DL2b overlap each other and are coupled to each other through a third contact hole CH2a. The overlapping portion between the second pixel-unit data line DL2a and the second fan-out line DL2b may be in the fan-out area FTA. Te position of the overlapping portion between the second pixel-unit data line DL2a and the second fan-out line DL2b may be different in another embodiment, e.g., at least a portion thereof may be in display area DA.

An end of the second fan-out line DL2b and an end of the second link line DL2c are coupled to each other through a fourth contact hole CH2b. The overlapping portion between the second fan-out line DL2b and the second link line DL2c may be in the fan-out area FTA. The position of the overlapping portion between the second fan-out line DL2b and the second link line DL2c may be different in another embodiment, e.g., at least a portion thereof may be in the bent area BA.

Referring to FIG. 7A, the buffer layer BF, the first to third insulating layers INS1 to INS3, the passivation layer PSV, the fourth insulating layer INS4 and the fifth insulating layer INS5 are stacked on portions of the display area DA and the non-display area NDA. The bent-part insulating layer INS_B, the fourth insulating layer INS4, and the fifth insulating layer INS5 are stacked on the substrate in the bent area BA of the non-display area NDA.

The first data line DL1 is on the third insulating layer INS3 in the display area DA and on the second insulating layer INS2 in the fan-out area FTA, and may be on the bent-part insulating layer INS_B in the bent area BA. The first pixel-unit data line DL1a is provided on the third insulating layer INS3 in the display area DA. The first fan-out line DL1b is on the second insulating layer INS2 in the fan-out area FTA. The first link line DL1c is on the bent-part insulating layer INS_B in the bent area BA.

Exposing portions of an upper surface of the first fan-out line DL1b, the first contact hole CH1a, and the second contact hole CH1b, are in the third insulating layer INS3. The first pixel-unit data line DL1a and the first fan-out line CH1b overlap each other in a portion in which the first contact hole CH1a is formed, and are coupled to each other through the first contact hole CH1a. The first fan-out line DL1b and the first link line DL1c overlap each other in a portion in which the second contact hole CH1b is formed, and are coupled to each other through the second contact hole CH1b. A portion of the first link line DL1c is on the third insulating layer INS3 in the fan-out area FTA, but, in the bent area BA, it is provided on the bent-part insulating layer INS_B.

The first data line DL1 may be formed, for example, of the same material as that of the pixels of the display area DA through the same process.

According to an embodiment, the first pixel-unit data line DL1a may be formed through the same process as that of the source electrode and the drain electrode in the display area DA. For example, the first pixel-unit data line DL1a may be formed along with the source electrode and the drain electrode in the display area DA through a single photolithography process. Accordingly, the first pixel-unit data line DL1a may be formed of the same material as that of the source electrode and the drain electrode in the display area DA and formed in the same layer, that is, on the third insulating layer INS3.

The first fan-out line DL1b may be formed through the same process as the upper capacitor electrode in the display area DA. For example, the first fan-out line DL1b and the upper capacitor electrode may be formed through a single photolithography process. Accordingly, the first fan-out line DL1b and the upper capacitor electrode may be formed of the same material and in the same layer, e.g., on the second insulating layer INS2.

The first link layer DL1c may be formed through the same process as that of the first pixel-unit data line DL1a in the display area DA. For example, the first link layer DL1c may be formed along with the first pixel-unit data line DL1a in the display area DA through a single photolithography process. Accordingly, the first link layer DL1c and the first pixel-unit data line DL1a may be formed of the same material and on the third insulating layer INS3. In this regard, a portion of the first link line DL1c is on the bent-part insulating layer INS_B in the bent area BA.

Referring to FIG. 7B, the buffer layer BF, the first to third insulating layers INS1 to INS3, the passivation layer PSV, the fourth insulating layer INS4 and the fifth insulating layer INS5 are stacked on portions of the display area DA and the non-display area NDA. The bent-part insulating layer INS_B, the fourth insulating layer INS4, and the fifth insulating layer INS5 are stacked on bent area BA of non-display area NDA.

The second data line DL2 is on the third insulating layer INS3 in display area DA and on the first insulating layer INS1 in the fan-out area FTA, and on the bent-part insulating layer INS_B in the bent area BA. The second pixel-unit data line DL2a is on the third insulating layer INS3 in the display area DA. The second fan-out line DL2b is the first insulating layer INS1 in the fan-out area FTA. The second link line DL2c is on the bent-part insulating layer INS_B in the bent area BA.

Exposing portions of an upper surface of the second fan-out line DL2b, the third contact hole CH2a, and the fourth contact hole CH2b are in the second insulating layer INS2 and the third insulating layer INS3. The second pixel-unit data line DL2a and the second fan-out line DL2b overlap each other in a portion in which the third contact hole CH2a is formed, and are coupled to each other through the third contact hole CH2a. The second fan-out line DL2b and the second link line DL2c overlap each other in a portion in which the fourth contact hole CH2b is formed, and are coupled to each other through the fourth contact hole CH2b. A portion of the second link line DL2c is on the third insulating layer INS3 in the fan-out area FTA, but is on the bent-part insulating layer INS_B in the bent area BA.

According to an embodiment, the second pixel-unit data line DL2a may be formed through the same process as that of the source electrode and the drain electrode in the display area DA. For example, the second pixel-unit data line DL2a may be formed along with the source electrode and the drain electrode in the display area DA through a single photolithography process. Accordingly, the second pixel-unit data line DL2a may be formed of the same material as that of the source electrode and the drain electrode in the display area DA and formed in the same layer, e.g., on the third insulating layer INS3.

The second fan-out line DL2b may be formed through the same process as that of the gate electrode and the lower capacitor electrode in the display area DA. For example, the second fan-out line DL2b, the gate electrode and the lower capacitor electrode may be formed through a single photolithography process. Accordingly, the second fan-out line DL2b, the gate electrode and the lower capacitor electrode may be formed of the same material and in the same layer, e.g., on first insulating layer INS1.

The second link line DL2c may be formed through the same process as that of the source electrode and the drain electrode in the display area DA. For example, the second link line DL2c may be formed along with the source electrode and the drain electrode in display area DA through a single photolithography process. Accordingly, the second link layer DL2c, the source electrode, and the drain electrode may be formed of the same material and on the third insulating layer INS3. In this regard, a portion of the second link line DL2c is on the bent-part insulating layer INS_B in the bent area BA.

Referring to FIG. 7c, the first fan-out lines DL1b of the first data lines DL1 and the second fan-out lines DL2b of the second data lines DL2 are in different layers from each other and are alternately arranged on a plane. The first fan-out lines DL1b are on the second insulating layer INS2, and the second fan-out lines DL2b are on the third insulating layer INS3.

Because the first fan-out lines DL1b and the second fan-out lines DL2b form the above-mentioned structure, a comparatively large distance may be secured between adjacent data lines DL. For example, if the data lines DL are formed on one layer, the distance between adjacent data lines DL is comparatively small. However, if the data lines DL are alternately arranged on two different layers, the distance between adjacent data lines DL on each layer may be increased, and thus the degree of freedom in design of the data lines DL may be enhanced.

In the display device having the above-mentioned configuration, deviation in delay between data signals of the first data line DL1 and the second data line DL2 is reduced. As a result, a defect (e.g., a greenish defect of an image caused by such deviation in delay of a data signal) can be mitigated.

For example, in the first and second data lines DL1 and DL2, a data line DL that is coupled to a pixel column of the first and second pixel columns coupled to the first and second data lines DL1 and DL2 that represents a color, on which an influence of a resistance is greater than on the other color, has a line or contact structure having lower resistance than a data line DL coupled to the other pixel column. Thereby, deviation in the data signal delay is reduced.

In an embodiment, the resistance of the first data line DL1 coupled to the red pixels and the blue pixels is less than the resistance of the second data line DL2 coupled to the green pixels, and the degrees of delay in data signals to be applied to the first data line DL1 and the second data line DL2 are matched with each other, thus preventing a greenish defect.

Figure 8:
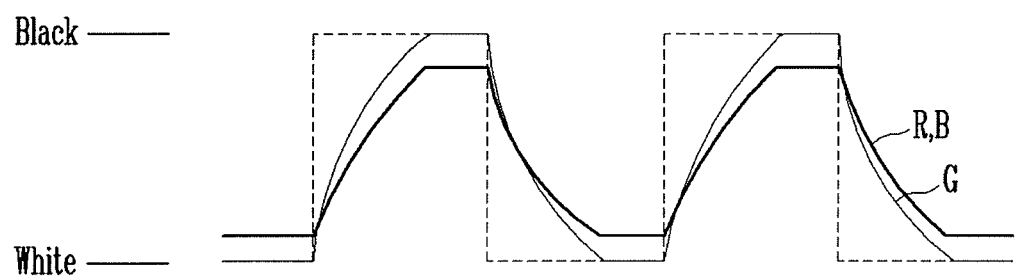
FIG. 8 illustrates an embodiment of a data voltage for one or more pixels.

FIG. 8 illustrates a waveform of a data voltage applied to each pixel, and related details will be described with reference to FIG. 8.

The swing widths of data voltages to be applied to the respective pixels may be different from each other. The swing width of the data voltage of the red pixel may be greater than the swing width of the data voltage of the green pixel. The swing width of the data voltage of the blue pixel may be greater than the swing width of the data voltage of the green pixel. For example, the swing widths of the data voltages of the red pixel and the blue pixel may be approximately 3V or more. The swing width of the data voltage of the green pixel may be, for example, less than approximately 3V. As a result, as shown in FIG. 8, when data voltages are applied to the red pixel R and the blue pixel B through the first data line DL1, the data voltages may not be sufficiently charged compared to the case where a data voltage is applied to the green pixel G through the second data line DL2. If sufficient data voltages are not charged to the red pixel R and the blue pixel B, the brightness of the red pixel and the blue pixel is reduced. As a result, a greenish defect of an image is caused.

Moreover, a line formed on the first insulating layer INS1 and a line formed on the second insulating layer INS2 may have different line widths and resistance values depending on the materials for forming the lines or processes for patterning the lines. Generally, the line width of the line on the first insulating layer INS1 is less than that of the line formed on the second insulating layer INS2. Furthermore, with regard to connection between the data lines DL through the contact holes, the thicker the insulating layer, the longer the contact path. In this regard, the case where a data line DL on the third insulating layer INS3 is coupled to the line on the first insulating layer INS1 has a longer contact path than the case where it is coupled to the line on the second insulating layer INS2.

Consequently, when the first data line DL1 coupled to the red pixels and the blue pixels is coupled to the line on the first insulating layer INS1 through a plurality of contact holes, delay of a data signal increases due to the resistance of the line, compared to the case where the first data line DL1 is coupled to the line on the second insulating layer INS2. This may result in a greenish defect.

In an embodiment, the first data line DL1, coupled to the red pixels and the blue pixels, swing widths of data voltages of which are relatively large, is coupled to the line on the second insulating layer INS2, which is relatively low in line resistance. The second data line DL2, coupled to the green pixels, a swing width of a data voltage of which is relatively small, is coupled to the line on the first insulating layer INS1. As a result, uneven color formation between the pixels is prevented.

In an embodiment, the red pixels, the blue pixels, and the green pixels are used as pixels representing first to third colors. In another embodiment, However, the first to third colors may be different. Also, in an embodiment, the swing widths of the data voltages of the red pixel and the blue pixel are greater than the swing width of the data voltage of the green pixel. In another embodiment, the swing widths of data voltages for respective colors may differ from the above description. For pixels representing other colors, the present embodiment may be used when a defect is caused by a reason such as a signal delay that occurs as the result of differences in swing widths of data voltages or resistance of data lines. According to an embodiment, the data lines may be provided in another form as described above.

Figure 9:
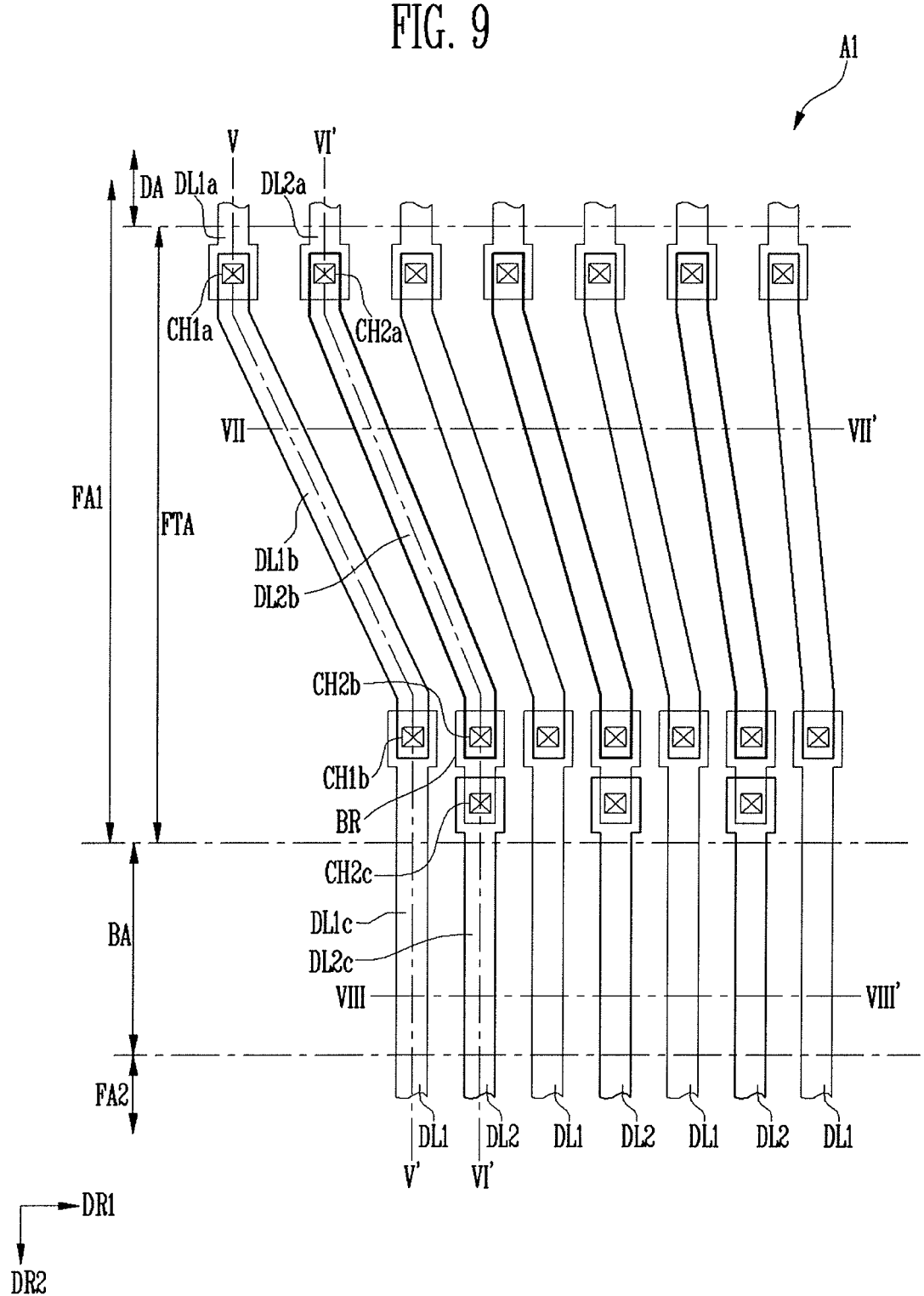
FIG. 9 illustrates an embodiment of data lines in the display device a portion corresponding to portion A1 in FIG. 2.
Figure 10A:
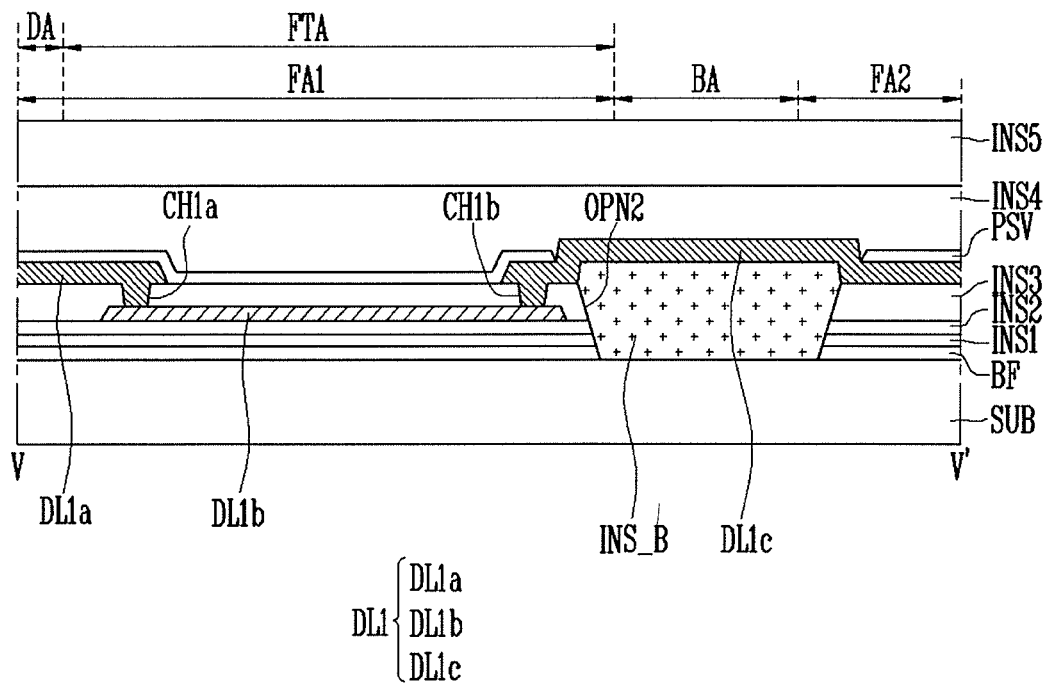
FIG. 10A illustrates a view taken along section line V-V' in FIG. 8.
Figure 10B:
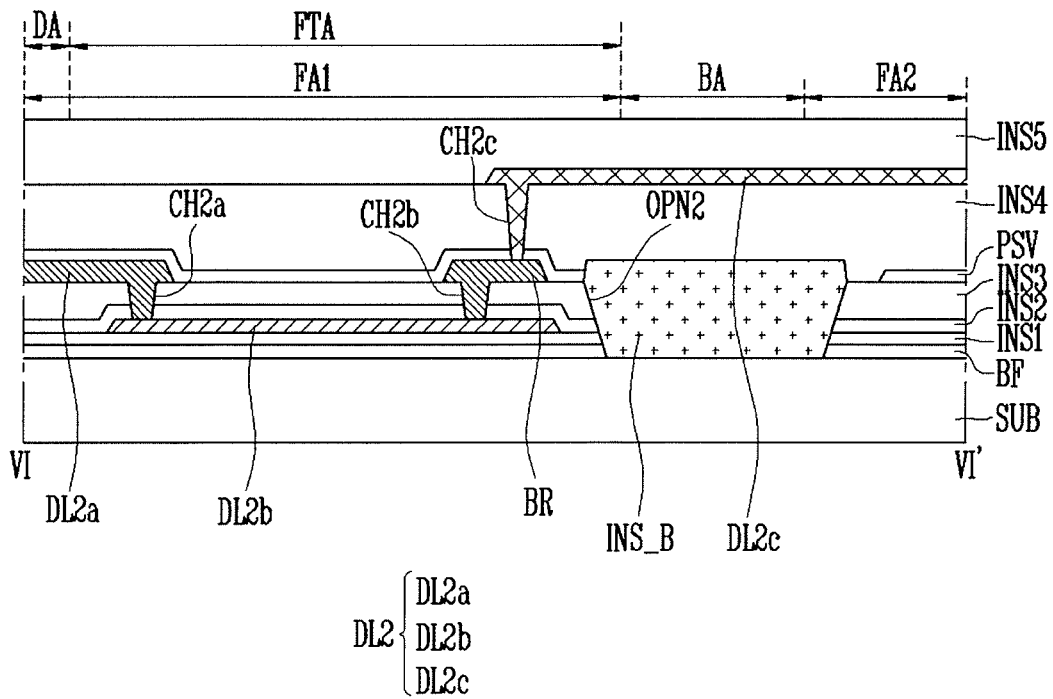
FIG. 10B illustrates a view taken along line section VI-VI' in FIG. 8.
Figure 10C:
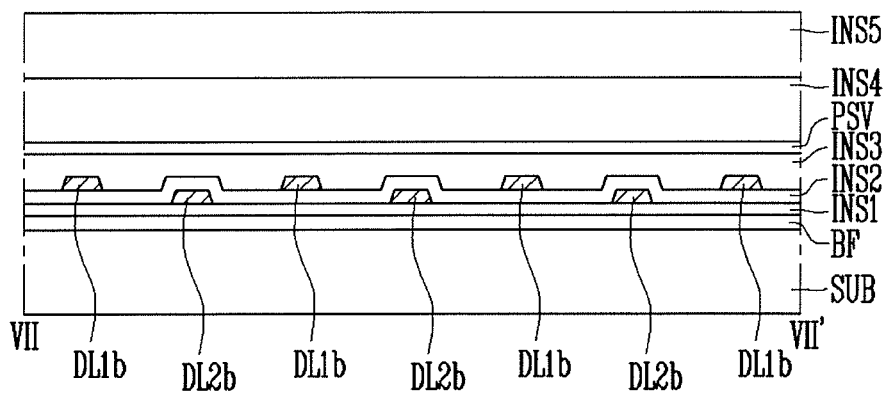
FIG. 10C illustrates a view taken along section line VII-VII' in FIG. 8.
Figure 10D:
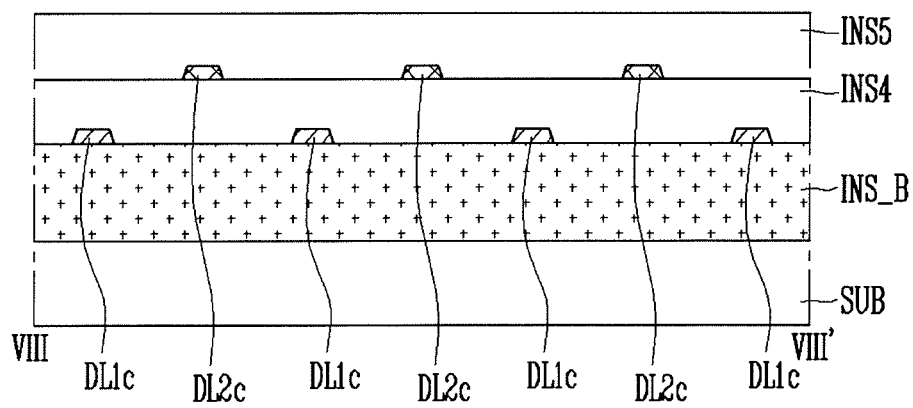
FIG. 10D illustrates a view taken along section line VIII-VIII' in FIG. 8.

FIG. 9 illustrates another embodiment of data lines in the display device and a portion corresponding to portion A1 of FIG. 2. FIG. 10A is a sectional view taken along line V-V' of FIG. 9, FIG. 10B is a sectional view taken along line VI-VI' of FIG. 9, FIG. 10C is a sectional view taken along line VII-VII' of FIG. 9, and FIG. 10D is a sectional view taken along line VIII-VIII' of FIG. 9.

Referring to FIGS. 9 and 10A to 10D, data lines DL include a first data line DL1 coupled to the first pixel column, and a second data line DL2 coupled to the second pixel column. First pixels of a first color and second pixels of a second color may be coupled to the first pixel column. The first color may be red and the second color may be blue. Third pixels of a third color may be coupled to the second pixel column. The third color may be green.

Referring to FIG. 9, the first data line DL1 and the second data line DL2 respectively comprise a plurality of first data lines DL1 and a plurality of second data lines DL2. The first and second data lines DL1 and DL2 are alternately arranged in the first direction DR1.

Each first data line DL1 includes a first pixel-unit data line DL1a in the display area DA, a first fan-out line DL1b in the fan-out area FTA, and a first link line DL1c in the bent area BA. The first pixel-unit data line DL1a is coupled to the first fan-out line DL1b, and the first fan-out line DL1b is coupled to the first link line DL1c. The first link line DL1c is coupled to the drive unit through a contact electrode or the like.

An end of the first pixel-unit data line DL1a and an end of the first fan-out line DL1b overlap each other and are coupled to each other through a first contact hole CH1a. An end of the first fan-out line DL1b and an end of the first link line DL1c are coupled to each other through a second contact hole CH1b.

Each second data line DL2 includes a second pixel-unit data line DL2a in the display area DA, a second fan-out line DL2b in the fan-out area FTA, a bridge pattern BR in the fan-out area FTA, and a second link line DL2c in the bent area BA.

The second pixel-unit data line DL2a is coupled to the second fan-out line DL2b, the second fan-out line DL2b is coupled to the bridge pattern BR, and the bridge pattern BR is coupled to the second link line DL2c. The second link line DL2c is coupled to the drive unit through a contact electrode or the like.

An end of the second pixel-unit data line DL2a and an end of the second fan-out line DL2b overlap each other and are coupled to each other through a third contact hole CH2a. The overlapping portion between the second pixel-unit data line DL2a and the second fan-out line DL2b may be disposed in the fan-out area FTA.

An end of the second fan-out line DL2b and a first end of the bridge pattern BR are coupled to each other through a fourth contact hole CH2b. The overlapping portion between the second fan-out line DL2b and the bridge pattern BR may be in the fan-out area FTA. In one embodiment, the position of the overlapping portion between the second fan-out line DL2b and the bridge pattern BR may be different, e.g., at least a portion thereof may be in the bent area BA.

A second end of the bridge pattern BR and the second link line DL2c are coupled to each other through a fifth contact hole CH2c. The overlapping portion between the second end of the bridge pattern BR and the second link line DL2c may be in the fan-out area FTA. In one embodiment, the position of the overlapping portion between the bridge pattern BR and the second link line DL2c may be different, e.g., at least a portion thereof may be in the bent area BA.

Referring to FIG. 10A, the buffer layer BF, the first to third insulating layers INS1 to INS3, the passivation layer PSV, the fourth insulating layer INS4 and the fifth insulating layer INS5 are stacked on the substrate in portions of the display area DA and the non-display area NDA. The bent-part insulating layer INS_B, the fourth insulating layer INS4 and the fifth insulating layer INS5 are stacked on the substrate in the bent area BA of the non-display area NDA.

The first data line DL1 is on the third insulating layer INS3 in the display area DA, on the second insulating layer INS2 in the fan-out area FTA, and on the bent-part insulating layer INS_B in the bent area BA. For example, the first pixel-unit data line DL1a is on the third insulating layer INS3 in the display area DA. The first fan-out line DL1b is on the second insulating layer INS2 in the fan-out area FTA. The first link line DL1c is on the bent-part insulating layer INS_B in the bent area BA.

Exposing portions of an upper surface of the first fan-out line DL1b, the first contact hole CH1a, and the second contact hole CH1b, are formed in the third insulating layer INS3. The first pixel-unit data line DL1a and the first fan-out line DL1b overlap each other in a portion in which the first contact hole CH1a is formed, and are coupled to each other through the first contact hole CH1a. The first fan-out line DL1b and the first link line DL1c overlap each other in a portion in which the second contact hole CH1b is formed, and are coupled to each other through the second contact hole CH1b. A portion of the first link line DL1c is on the third insulating layer INS3 in the fan-out area FTA but is provided on the bent-part insulating layer INS_B in the bent area BA.

The first data line DL1 may be formed using the same material as that of the pixels of the display area DA through the same process.

According to an embodiment, the first pixel-unit data line DL1a may be formed through the same process as that of the source electrode and the drain electrode in the display area DA. The first fan-out line DL1b may be formed through the same process as that of the upper capacitor electrode in the display area DA. The first link layer DL1c may be formed through the same process as that of the first pixel-unit data line DL1a in the display area DA.

Referring to FIG. 10B, the buffer layer BF, the first to third insulating layers INS1 to INS3, the passivation layer PSV, the fourth insulating layer INS4, and the fifth insulating layer INS5 are stacked on portions of the display area DA and the non-display area NDA. The bent-part insulating layer INS_B, the fourth insulating layer INS4, and the fifth insulating layer INS5 are stacked on the bent area BA of non-display area NDA.

The second data line DL2 is on the third insulating layer INS3 in the display area DA, on the first insulating layer INS1 in the fan-out area FTA, and on the bent-part insulating layer INS_B in the bent area BA. The second pixel-unit data line DL2a is on the third insulating layer INS3 in the display area DA. The second fan-out line DL2b is on the first insulating layer INS1 in the fan-out area FTA. The bridge pattern BR is on the third insulation layer INS3 in the fan-out area FTA. The second link line DL2c is on the bent-part insulating layer INS_B in the bent area BA.

Exposing portions of an upper surface of the second fan-out line DL2b, the third contact hole CH2a, and the fourth contact hole CH2b are formed in the second insulating layer INS2 and the third insulating layer INS3. A fifth contact hole CH2c is formed in the passivation layer and the fourth insulating layer INS4 to expose a portion of an upper surface of the bridge pattern BR.

The second pixel-unit data line DL2a and the second fan-out line DL2b overlap each other in a portion in which the third contact hole CH2a is formed, and are coupled to each other through the third contact hole CH2a. The second fan-out line DL2b and the bridge pattern BR overlap each other in a portion in which the fourth contact hole CH2b is formed, and are coupled to each other through the fourth contact hole CH2b. The bridge pattern BR and the second link line DL2c overlap each other in a portion in which the fifth contact hole CH2c is formed, and are coupled to each other through the fifth contact hole CH2c. A portion of the second link line DL2c is on the third insulating layer INS3 in the fan-out area FTA, but is on the bent-part insulating layer INS_B in the bent area BA.

According to an embodiment, the second pixel-unit data line DL2a may be formed through the same process as that of the source electrode and the drain electrode in the display area DA. The second fan-out line DL2b may be formed through the same process that of as the gate electrode and lower capacitor electrode in display area DA.

The bridge pattern BR may be formed through the same process as that of the source electrode and the drain electrode in the display area DA. For example, the bridge pattern BR may be formed along with the source electrode and the drain electrode in the display area DA through a single photolithography process. Accordingly, the bridge pattern BR, the source electrode, and the drain electrode may be formed of the same material and formed on the third insulating layer INS3.

The second link line DL2c may be formed through the same process as that of the connection pattern in the display area DA. The second link line DL2c may be formed along with the connection pattern in display area DA through a single photolithography process. Accordingly, the second link layer DL2c and the connection pattern may be formed of the same material and formed on the fourth insulating layer INS4. In this regard, a portion of the second link line DL2c is on the fourth insulating layer INS4 in the bent area BA.

Referring to FIG. 10c, the first fan-out lines DL1b of the first data lines DL1 and the second fan-out lines DL2b of the second data lines DL2 are in different layers from each other, and are alternately arranged on a plane. The first fan-out lines DL1b are on the second insulating layer INS2, and the second fan-out lines DL2b are on the first insulating layer INS1. Because the first fan-out lines CH1b and the second fan-out lines DL2b form the above-mentioned structure, a comparatively large distance may be secured between adjacent data lines DL.

Referring to FIG. 10D, the first link lines DL1c of the first data lines DL1 and the second link lines DL2c of the second data lines DL2 are in different layers from each other. The first link lines DL1c are on the bent-part insulating layer INS_B. The second link lines DL2c are on the fourth insulating layer INS4. The first link lines DL1c of the first data lines DL1 and the second link lines DL2c of the second data lines DL2 are alternately arranged on a plane.

Because the first link lines DL1c and the second link lines DL2c form the above-mentioned structure, a comparatively large distance may be secured between adjacent data lines DL. For example, if the data lines DL are formed on one layer, the distance between adjacent data lines DL is comparatively small. However, if the data lines DL are alternately arranged on two different layers, the distance between adjacent data lines DL on each layer may be increased. As a result, the degree of freedom in design of the data lines DL may be enhanced.

In the display device having the above-mentioned configuration, a delay deviation between data signals of the first data line and the second data line is reduced. As a result, a defect caused by the data signal delay deviation can be mitigated. In an embodiment, the display device is configured such that the resistance of the first data line coupled to the red pixels and the blue pixels is less than the resistance of the second data line coupled to the green pixels, and the degrees of delay in data signals to be applied to the first data line and the second data line are matched with each other, thus preventing a greenish defect. In the present embodiment, the length of the first data line and the number of contact holes in the first data line are less than those of the second data line, so that a contact path between lines coupled to each other can be increased. As a result, deviation in resistance may be more easily reduced. According to an embodiment, the data lines may be in another form different from that of the above-described embodiments.

Figure 12A:
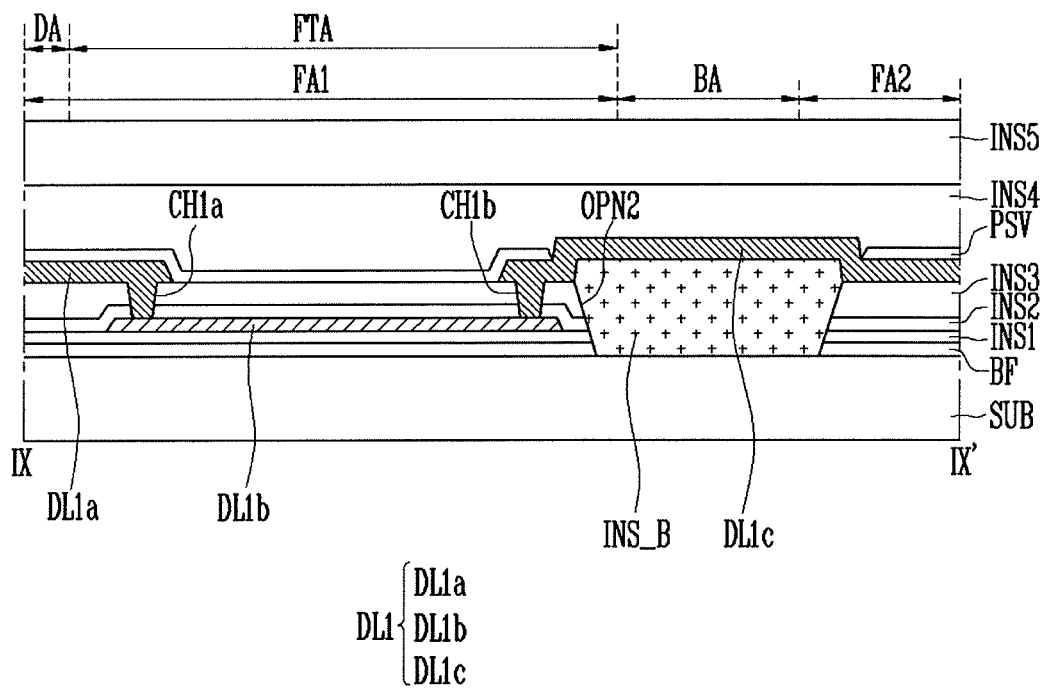
FIG. 12A illustrates a view taken along section line IX-IX' of FIG. 11.
Figure 12B:
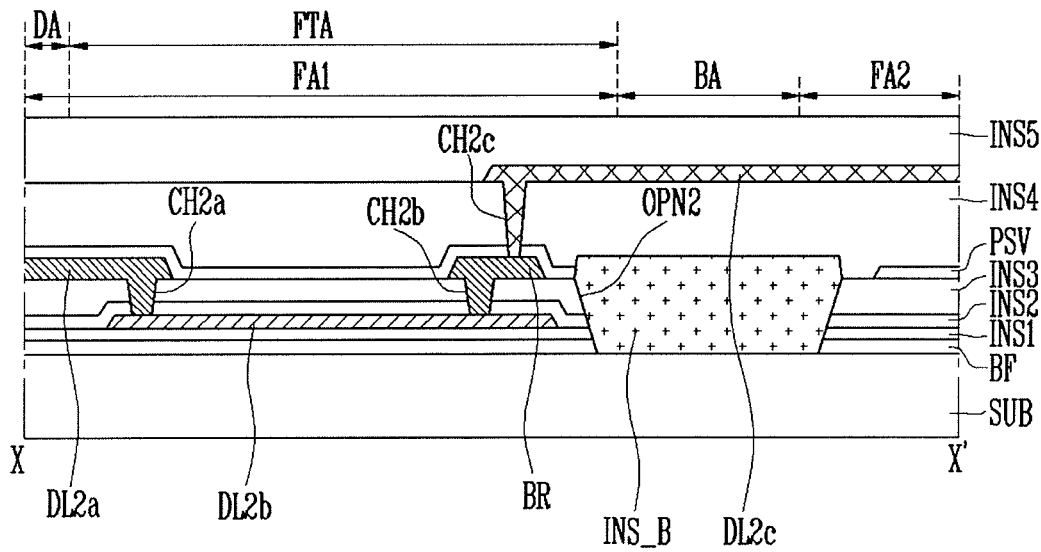
FIG. 12B illustrates a view taken along section line X-X' of FIG. 11.
Figure 12C:
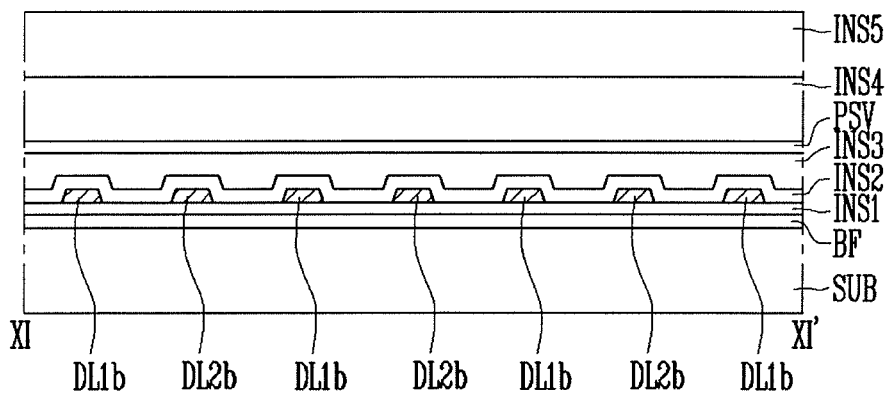
FIG. 12C illustrates a view taken along section line XI-XI' of FIG. 11.
Figure 12D:
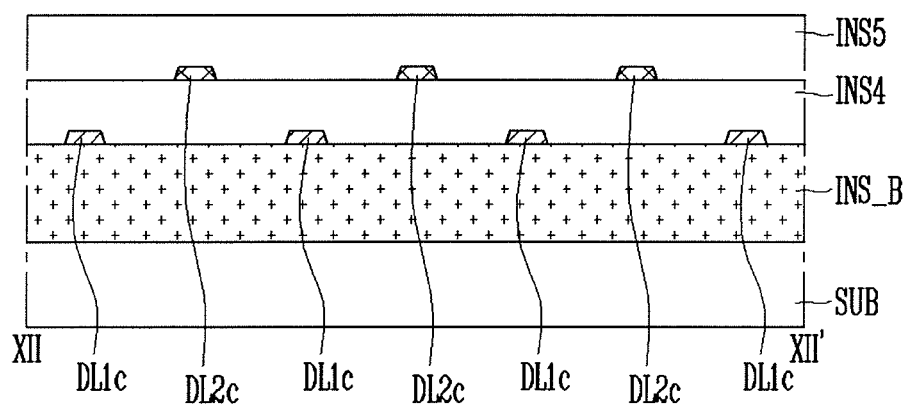
FIG. 12D illustrates a view taken along section line XII-XII' in FIG. 11.

FIG. 11 illustrates an embodiment of data lines in the display device and a portion corresponding to portion A1 of FIG. 2. FIG. 12A is a sectional view taken along line IX-IX' of FIG. 11, FIG. 12B is a sectional view taken along line X-X' of FIG. 11, FIG. 12C is a sectional view taken along line XI-XI' of FIG. 11, and FIG. 12D is a sectional view taken along line XII-XII' of FIG. 11.

Referring to FIGS. 11 and 12A to 12D, data lines DL include a first data line DL1 coupled to the first pixel column, and a second data line DL2 coupled to the second pixel column. First pixels of a first color and second pixels of a second color may be coupled to the first pixel column. The first color may be red, and the second color may be blue. Third pixels of a third color may be coupled to the second pixel column. The third color may be green.

Referring to FIG. 11, the first data line DL1 and the second data line DL2 respectively comprise a plurality of first data lines DL1 and a plurality of second data lines DL2. The first and second data lines DL1 and DL2 are alternately arranged in the first direction DR1.

Each first data line DL1 includes a first pixel-unit data line DL1a in the display area DA, a first fan-out line DL1b in the fan-out area FTA, and a first link line DL1c in the bent area BA. The first pixel-unit data line DL1a is coupled to the first fan-out line DL1b. The first fan-out line DL1b is coupled to the first link line DL1c. The first link line DL1c is coupled to the drive unit through a contact electrode or the like.

Referring to FIG. 12A, the first data line DL1 is on the third insulating layer INS3 in the display area DA, on the first insulating layer INS1 in the fan-out area FTA, and on the bent-part insulating layer INS_B in the bent area BA. The first pixel-unit data line DL1a is on the third insulating layer INS3 in the display area DA. The first fan-out line DL1b is on the first insulating layer INS1 in the fan-out area FTA. The first link line DL1c is on the bent-part insulating layer INS_B in the bent area BA.

Exposing portions of an upper surface of the first fan-out line DL1*b*, the first contact hole CH1*a*, and the second contact hole DL1*b* are formed in the third insulating layer INS3. The first pixel-unit data line DL1*a* and the first fan-out line DL1*b* overlap each other in a portion in which the first contact hole CH1*a* is formed, and are coupled to each other through the first contact hole CH1*a*. The first fan-out line DL1*b* and the first link line DL1*c* overlap each other in a portion in which the second contact hole CH1*b* is formed, and are coupled to each other through the second contact hole CH1*b*. A portion of the first link line DL1*c* is on the third insulating layer INS3 in the fan-out area FTA but is on the bent-part insulating layer INS_B in the bent area BA.

The first data line DL1 may be formed using the same material as that of the pixels of the display area DA through the same process.

According to an embodiment, the first pixel-unit data line DL1*a* may be formed through the same process as that of the source electrode and the drain electrode in the display area DA. The first fan-out line DL1*b* may be formed through the same process as that of the gate electrode and the lower capacitor electrode in the display area DA. The first link layer DL1*c* may be formed through the same process as that of the first pixel-unit data line DL1*a* in the display area DA.

Referring to FIG. 12B, the second data line DL2 is on the third insulating layer INS3 in the display area DA, on the first insulating layer INS1 in the fan-out area FTA, and on the bent-part insulating layer INS_B in the bent area BA. For example, the second pixel-unit data line DL2*a* is on the third insulating layer INS3 in the display area DA. The second fan-out line DL2*b* is on the first insulating layer INS1 in the fan-out area FTA. The bridge pattern BR is on the third insulation layer INS3 in the fan-out area FTA. The second link line DL2*c* is on the bent-part insulating layer INS_B in the bent area BA.

Exposing portions of an upper surface of the second fan-out line DL2*b*, the third contact hole CH2*a*, and the fourth contact hole CH2*b* are formed in the second insulating layer INS2 and the third insulating layer INS3. A fifth contact hole CH2*c* is formed in the passivation layer and the fourth insulating layer INS4 to expose a portion of an upper surface of the bridge pattern BR.

The second pixel-unit data line DL2*a* and the second fan-out line DL2*b* overlap each other in a portion in which the third contact hole CH2*a* is formed, and are coupled to each other through the third contact hole CH2*a*. The second fan-out line DL2*b* and the bridge pattern BR overlap each other in a portion in which the fourth contact hole CH2*b* is formed, and are coupled to each other through the fourth contact hole CH2*b*. The bridge pattern BR and the second link line DL2*c* overlap each other in a portion in which the fifth contact hole CH2*c* is formed, and are coupled to each other through the fifth contact hole CH2*c*. A portion of the second link line DL2*c* is provided on the third insulating layer INS3 in the fan-out area FTA, but is provided on the bent-part insulating layer INS_B in the bent area BA.

According to an embodiment, the second pixel-unit data line DL2*a* may be formed through the same process as that of the source electrode and the drain electrode in the display area DA. The second fan-out line DL2*b* may be formed through the same process as that of the gate electrode and lower capacitor electrode in display area DA.

Referring to FIG. 12*c*, the first fan-out lines DL1*b* of the first data lines DL1 and the second fan-out lines DL2*b* of the second data lines DL2 are in the same layer from each other, and are alternately arranged on a plane. Both the first fan-out lines DL1*b* and the second fan-out lines DL2*b* are disposed on the first insulating layer INS1.

Referring to FIG. 12D, the first link lines DL1*c* of the first data lines DL1 and the second link lines DL2*c* of the second data lines DL2 are in different layers from each other. The first link lines DL1*c* are on the bent-part insulating layer INS_B, and the second link lines DL2*c* are on the fourth insulating layer INS4. The first link lines DL1*c* of the first data lines DL1 and the second link lines DL2*c* of the second data lines DL2 are alternately arranged on a plane.

In the display device having the above-mentioned configuration, a delay deviation between data signals of the first data line and the second data line is reduced. As a result, a defect caused by the data signal delay deviation can be mitigated. In an embodiment, the display device is configured such that the resistance of the first data line coupled to the red pixels and the blue pixels is less than the resistance of the second data line coupled to the green pixels, and the degrees of delay in data signals to be applied to the first data line and the second data line are matched with each other, thus preventing a greenish defect.

In the present embodiment, although the first data line and the second data line are formed in the same layer in the fan-out area, the first and second link lines differ not only in length but also in the number of contact holes from each other. Therefore, contact paths between lines coupled to each other differ between the first and second data line. Since the length of the contact path of the second data line DL2 is increased, deviation in resistance between the first and second data lines is reduced.

The first data line and the second data line in the fan-out area have been illustrated as being formed on the first insulating layer. In another embodiment, both the first data line and the second data line in the fan-out area may be provided on the second insulating layer. In this case, the first data line and the second data line in the fan-out area may be formed through the same process as that of the upper capacitor electrode.

According to an embodiment, the data lines may be provided in another form different from that of the above-described embodiments to match the resistances of the data lines.

Figure 13:
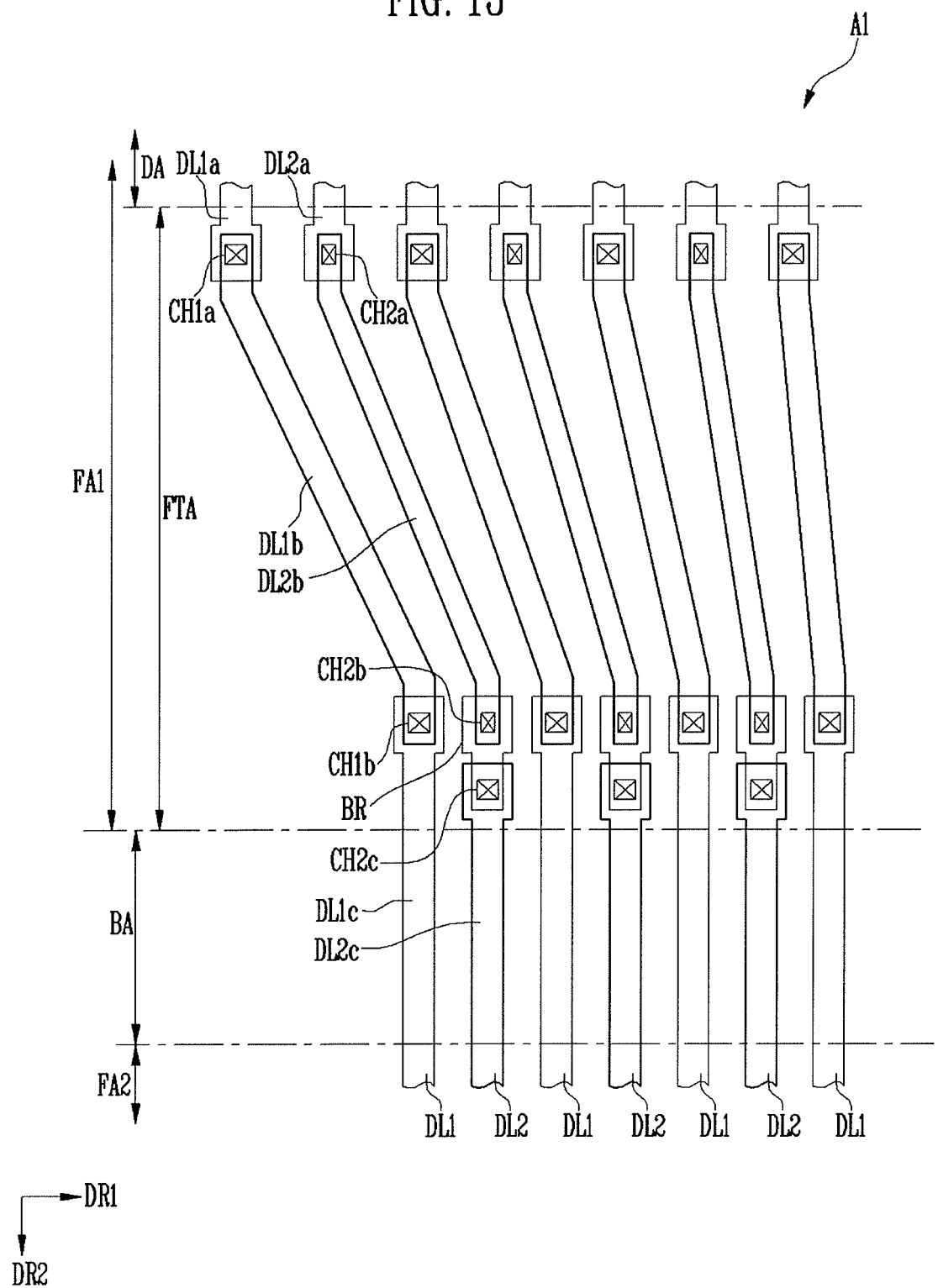
FIG. 13 illustrates another embodiment of data lines in the display device and a portion corresponding to portion A1 in FIG. 2.

FIG. 13 illustrates another embodiment of data lines in the display device and a portion corresponding to portion A1 of FIG. 2. Referring to FIG. 13, the first data line DL1 and the second data line DL2 respectively comprise a plurality of first data lines DL1 and a plurality of second data lines DL2. The first and second data lines DL1 and DL2 are alternately arranged in the first direction DR1.

Each first data line DL1 includes a first pixel-unit data line DL1*a* in the display area DA, a first fan-out line DL1*b* in the fan-out area FTA, and a first link line DL1*c* in the bent area BA. The first pixel-unit data line DL1*a* is coupled to the first fan-out line DL1*b*, and the first fan-out line DL1*b* is coupled to the first link line DL1*c*. The first link line DL1*c* is coupled to the drive unit through a contact electrode or the like.

Each second data line DL2 includes a second pixel-unit data line DL2*a* in the display area DA, a second fan-out line DL2*b* in the fan-out area FTA, and a second link line DL2*c* in the bent area BA. The second pixel-unit data line DL2*a* is coupled to the second fan-out line DL2*b*. The second fan-out line DL2*b* is coupled to the second link line DL2*c*. The second link line DL2*c* is coupled to the drive unit through a contact electrode or the like.

In the present embodiment, the first data line DL1 and the second data line DL2 may have different widths in the non-display area. For example, the first fan-out line DL1*b* in the fan-out area FTA may have a width greater than that of the second fan-out line DL2b. Since the width of the first fan-out line DL1b is greater than that of the second fan-out line DL2b, the resistance of the first fan-out line DL1b may be lower than that of the second fan-out line DL2b.

The first data line DL1 and the second data line DL2 in the fan-out area FTA may be formed in the same layer.

In accordance with the present embodiment, the widths of the first and second fan-out lines DL1b and DL2b, the lengths of the first and second link lines, and the numbers of contact holes differ from each other between the first data line DL1 and the second data line DL2. Therefore, contact paths between lines coupled to each other differ between the first and second data line. Since the length of the contact path of the second data line DL2 is increased, deviation in resistance between the first and second data lines is reduced.

In the present embodiment, only the first and second fan-out lines DL1b and DL2b have different widths. In another embodiment, in order to reduce deviation in resistance between the first data line DL1 and the second data line DL2, the widths of the first and second link lines DL1c and DL2c may also be changed to different values.

The display device in accordance with the aforementioned embodiments may be employed in various electronic devices. For instance, the display device may be applied to a television, a notebook computer, a cellular phone, a smartphone, a smartpad, a PMP (portable multimedia player), a PDA (personal digital assistant), a navigation device, various kinds of wearable devices such as a smartwatch, etc.

According to embodiments, there is provided a display device which is able to reduce an image greenish defect by matching a resistance deviation of data signals between a first data line and a second data line with that of pixels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A display device, comprising:
a substrate including a display area and a non-display area;
a pixel area in the display area, the pixel area divided into a plurality of first pixel columns including first pixels and second pixels, and a plurality of second pixel columns including third pixels, the third pixels being of a same third color only, and the first and second pixels being of first and/or second colors that are different from the third color;
first data lines respectively coupled to the first pixel columns; and
second data lines respectively coupled to the second pixel columns,
wherein a swing width of a data voltage sent by a data drive unit corresponding to the first and/or second colors is greater than a swing width of a data voltage sent by the data drive unit corresponding to the third color, and
wherein each of the first data lines has a first line structure or first contact structure having a first resistance that is less than a second resistance of a second line structure or second contact structure of each of the second data lines, such that an overall resistance between the data drive unit and each of the first pixel columns is less than an overall resistance between the data drive unit and each of the second pixel columns.

2. The display device as claimed in claim 1, wherein, the non-display area, a resistance of each of the first data lines is less than a resistance of each of the second data lines.

3. The display device as claimed in claim 2, wherein, in the non-display area, a length of each of the first data lines is less than a length of each of the second data lines.

4. The display device as claimed in claim 1, wherein:
each of the first pixel columns includes the first pixels and the second pixels in the display area arranged in a column direction, the first pixels to emit light of the first color and the second pixels to emit light of the second color, the second pixels being arranged alternately with the first pixels; and
each of the second pixel columns includes the third pixels to emit light of the third color.

5. The display device as claimed in claim 4, further comprising first to third insulating layers successively stacked on the substrate,
wherein a first data line is on the third insulating layer in the display area and is at least partially on the second insulating layer in the non-display area, and
a second data line is on the third insulating layer in the display area and is at least partially on the first insulating layer in the non-display area.

6. The display device as claimed in claim 5, wherein:
the first color is red;
the second color is blue; and
the third color is green.

7. The display device as claimed in claim 6, wherein the non-display area includes a fan-out area adjacent to the display area.

8. The display device as claimed in claim 7, wherein:
the first data line is on the second insulating layer in the fan-out area; and
the second data line is on the first insulating layer in the fan-out area.

9. The display device as claimed in claim 7, wherein the non-display area includes a bent area adjacent to the fan-out area.

10. The display device as claimed in claim 9, wherein the first data line includes a first pixel-unit data line in the display area, a first fan-out line in the fan-out area, and a first link line in the bent area.

11. The display device as claimed in claim 10, wherein the first pixel-unit data line and the first link line are on the third insulating layer, and the first fan-out line is on the second insulating layer.

12. The display device as claimed in claim 11, wherein:
the third insulating layer includes first and second contact holes that expose portions of the first fan-out lines;
the first pixel-unit data line is coupled to the first fan-out line through the first contact hole; and
the first fan-out line is coupled to the first link line through the second contact hole.

13. The display device as claimed in claim 10, wherein the second data line includes a second pixel-unit data line in the display area, a second fan-out line in the fan-out area, and a second link line in the bent area.

14. The display device as claimed in claim 13, wherein:
   the second and third insulating layers include third and fourth contact holes that expose portions of the second fan-out line;
   the second pixel-unit data line is coupled to the second fan-out line through the third contact hole; and
   the second fan-out line is coupled to the second link line through the fourth contact hole.

15. The display device as claimed in claim 13, further comprising a bent-part insulating layer in the bent area of the substrate.

16. The display device as claimed in claim 15, wherein:
   the first to third insulating layers have an opening that exposes a portion of the substrate; and
   the bent-part insulating layer is in the opening.

17. The display device as claimed in claim 15, wherein:
   at least a portion of the first data line is on the bent-part insulating layer in the bent area; and
   at least a portion of the second data line is on the bent-part insulating layer in the bent area.

18. The display device as claimed in claim 17, wherein:
   the first pixel-unit data line is on the third insulating layer;
   the first fan-out line is on the second insulating layer; and
   the first link line is on the bent-part insulating layer.

19. The display device as claimed in claim 17, wherein:
   the second pixel-unit data line is on the third insulating layer;
   the second fan-out line is on the first insulating layer; and
   the second link line is on the bent-part insulating layer.

20. The display device as claimed in claim 13, further comprising a fourth insulating layer on the third insulating layer,
   wherein the second data line includes a bridge pattern in the fan-out area.

21. The display device as claimed in claim 20, wherein:
   the second pixel-unit data line is on the third insulating layer;
   the second fan-out line is on the first insulating layer;
   the bridge pattern is on the third insulating layer; and
   the second link line is on the fourth insulating layer.

22. The display device as claimed in claim 21, wherein:
   the second and third insulating layers have third and fourth contact holes that expose portions of the second fan-out line;
   the fourth insulating layer has a fifth contact hole that exposes a portion of the bridge pattern;
   the second pixel-unit data line is coupled to the second fan-out line through the third contact hole;
   the second fan-out line is coupled to the bridge pattern through the fourth contact hole; and
   the bridge pattern is coupled to the second link line through the fifth contact hole.

23. The display device as claimed in claim 5, wherein each of the first pixels, the second pixels, and the third pixels includes a transistor which includes:
   an active layer on the substrate;
   a gate electrode on the first insulating layer;
   an upper capacitor electrode on the second insulating layer; and
   a source electrode and a drain electrode on the third insulating layer.

24. The display device as claimed in claim 23, wherein a portion of the first data line or the second data line in the non-display area is on a same layer as the source electrode and the drain electrode are provided and includes a same material as is in the source electrode and the drain electrode.

25. The display device as claimed in claim 23, wherein a portion of the second data line in the non-display area is on a same layer as the gate electrode and includes a same material as is in the gate electrode.

26. The display device as claimed in claim 23, wherein a portion of the first data line in the non-display area is on a same layer as the upper capacitor electrode and includes a same material as in the upper capacitor electrode.

27. The display device as claimed in claim 23, further comprising:
   a fourth insulating layer on the third insulating layer; and
   connection patterns on the fourth insulating layer and coupled to the drain electrode, wherein a portion of the second data line in the non-display area is on a same layer as the connection patterns and includes a same material as is in the connection patterns.

28. The display device as claimed in claim 4, wherein areas of at least two pixels among the first pixels, the second pixels, and the third pixels differ from each other.

29. The display device as claimed in claim 1, wherein:
   the first pixel columns and the second pixel columns are alternately arranged in a row direction.

30. The display device as claimed in claim 29, wherein:
   the first data lines and the second data lines are alternately arranged in the row direction.

31. A display device, comprising:
   a substrate including a display area and a non-display area;
   a pixel area in the display area, the pixel area including a first pixel column including a plurality of pixels and a second pixel column including a plurality of pixels, the second pixel column including pixels of a same color only, and the first pixel column including pixels of colors which are different from a color of the pixels included in the second pixel column; and
   a plurality of data lines respectively coupled to the first pixel column and the second pixel column,
   wherein:
      a first data line is coupled to the first pixel column corresponding to a color for which a swing width of a data voltage sent by a data drive unit is greater than for another color, and, in the non-display area, has a line structure or contact structure with a resistance that is less than a resistance of a line structure or contact structure of a second data line coupled to the second pixel column, such that a respective overall resistance between the data drive unit and each of the first and second pixel columns depends on each color in the respective pixel columns;
      a resistance of the first data line is less than a resistance of the second data line; and
      a width of the first data line is greater than a width of the second data line.

32. A display device, comprising:
   a substrate including a display area and a non-display area;
   a pixel area in the display area, the pixel area including a first pixel column including a plurality of pixels and a second pixel column including a plurality of pixels, the second pixel column including pixels of a same color only, and the first pixel column including pixels of colors which are different from a color of the pixels included in the second pixel column; and
   a plurality of data lines respectively coupled to the first pixel column and the second pixel column, wherein:
- a first data line is coupled to the first pixel column corresponding to a color for which a swing width of a data voltage sent by a data drive unit is greater than for another color, and, in the non-display area, has a line structure or contact structure with a resistance that is less than a resistance of a line structure or contact structure of a second data line coupled to the second pixel column, such that a respective overall resistance between the data drive unit and each of the first and second pixel columns depends on each color in the respective pixel columns;
- a resistance of the first data line is less than a resistance of the second data line;
- portions of each of the data lines are coupled to each other through at least one contact hole; and
- the portions of the first data line are coupled to each other through a smaller number of contact holes than are the portions of the second data line.

* * * * *